United States Patent [19]

Gray et al.

[11] Patent Number: 4,901,028
[45] Date of Patent: Feb. 13, 1990

[54] FIELD EMITTER ARRAY INTEGRATED DISTRIBUTED AMPLIFIERS

[75] Inventors: Henry F. Gray, Alexandria, Va.; Richard F. Greene, Bethesda, Md.

[73] Assignee: The United States of America as represented by the Secretary of the Navy, Washington, D.C.

[21] Appl. No.: 171,706

[22] Filed: Mar. 22, 1988

[51] Int. Cl.⁴ ............................................ H03F 3/60
[52] U.S. Cl. .................................................... 330/54
[58] Field of Search .................. 330/54; 313/309, 336, 313/351

[56] References Cited

U.S. PATENT DOCUMENTS

| | | | |
|---|---|---|---|
| 3,755,704 | 8/1973 | Spindt et al. | 313/309 |
| 4,307,507 | 12/1981 | Gray et al. | 29/580 |
| 4,513,308 | 4/1985 | Greene et al. | 357/55 |
| 4,578,614 | 3/1986 | Gray et al. | 313/309 |
| 4,721,885 | 1/1988 | Brodie | 313/309 X |
| 4,780,684 | 10/1988 | Kosmahl | 330/54 |

FOREIGN PATENT DOCUMENTS

| | | | |
|---|---|---|---|
| 121454 | 10/1978 | Japan | 313/309 |
| 460562 | 1/1937 | United Kingdom . | |

OTHER PUBLICATIONS

Spindt, "A Thin-Film Field-Emission Cathode", *J. of Applied Physics*, vol. 39, No. 7, Jun. 1968 pp. 3504-3505.
E. L. Ginzton et al., "Distributed Amplification", Proceedings of the I.R.E., Aug. 1948, pp. 956-969.
W. H. Horton et al., "Distributed Amplifiers: Practical Considerations and Experimental Results", Proceedings of the I.R.E., Jul. 1950, pp. 748-753.
Joseph Mayo Pettit et al., "Electronic Amplifier Circuits Theory and Design", Printed in McGraw-Hill Electrical and Electronic Engineering Series, Chapter 6, pp. 147-162.
R. K. Feeney et al., "High-Field Electron Emission From Oxide-Metal Composite Materials", Reprint in Journal of Applied Physics, vol. 46, No. 4, Apr. 1975, pp. 1841-1843.
C. A. Spindt et al., "Physical Properties of Thin-Film Field Emission Cathodes with Molybdenum Cones", Printed in Journal of Applied Physics, vol. 47, No. 12, Dec. 1976, pp. 5248-5263.
Robert T. Gallagher et al. "Flat-Panel Display Built That Could Compete With CRTs", Printed in Electronics, Jun. 16, 1986, pp. 18-19.

*Primary Examiner*—James B. Mullins
*Attorney, Agent, or Firm*—Thomas E. McDonnell; Edward F. Miles; Andrew M. Lesniak

[57] ABSTRACT

Distributed amplifiers in integrated circuit form wherein dielectric material and electrically conductive material combine to form field emitter cathodes, grids, and anodes in a module forming one or more amplifier cells embedded in a matrix of reactive impedances that form companion stripline-like transmission lines in a vacuum or sufficiently low pressure gas such that electrons remain unscattered during travel over trajectories from cathode to anode in a cell.

9 Claims, 15 Drawing Sheets

FIELD EMITTER ARRAY INTEGRATED DISTRIBUTED AMPLIFIERS

BACKGROUND OF THE INVENTION

This invention relates to distributed amplifiers and relates in particular to Field Emitter Arrays used to form Integrated Distributed Amplifiers.

Distributed amplifiers are shown and described in an Article entitled "Distributed Amplification", by E. L. Ginzton et al., published in the Proceedings of the I.R.E., August 1948, pp. 956-969, and in W. S. Percival's British patent specification No. 460,562 where the basic concepts of distributed amplifiers composed of lumped circuit elements e.g. individual vacuum tubes, are discussed.

Distributed amplifiers, as shown in the Ginzton et al. Article, combine amplifier tubes in a series-like circuit in which tube capacitances (i.e. plate capacitance $C_p$ and grid capacitance $C_g$) and tube inductances (i.e. plate inductance $L_p$ and grid inductance $L_g$) may be considered separately. Results are achieved by using the tube capacitances and inductances as lumped circuit elements of a pair of artifical transmission lines in the manner shown in FIG. 1 of the Ginzton et al. Article. Companion transmission lines are formed, with cathode-grid regions of the tubes forming part of one transmission line, and with grid-anode regions of the tubes forming part of another transmission line. These transmission lines are "quasi" transmission lines that only approximate real transmission lines because of the discrete nature of the tubes and the lumped element nature of the impedances interconnecting the tubes.

Ginzton et al. show that ordinary electron tubes in artificial transmission lines make possible wave signal amplification over wide bandwidths. Today, distributed amplifiers typically assume one or two forms: one form of amplifier being based on solid state electron transport, i.e., semiconductors (transistors), and another form of amplifier being based on vacuum electron transport, i.e. vacuum tubes such as the traveling wave tube (TWT). Each form has its own unique limitations.

Power semiconductor devices forming distributed amplifiers are limited in their frequency response by electron saturation drift velocity (about $3 \times 10^7$ centimeter per second cm/s) and by the inherent capacitance of the channel area of the field effect transistor (FET) or the base area of the bipolar transistor used as the basic component module. Furthermore, because of these two limitations, they cannot be made to have a wide-bandwidth characteristic because of the unavoidable dispersion of, and high value of, electron transit times as electrons transit from their cathodes (e.g., emitters) past one or more grids (e.g., gates) to their anodes (e.g., collectors).

Conventional vacuum tubes (excluding TWTs) suffer from a different set of problems when compared to semiconductor devices. First, spacing of conventional vacuum tube electrodes is too large to allow grid modulation at frequencies much above about 5 gigahertz (ghz), because the electrodes are mechanically "machined" during tube fabrication. Hence, even 1-2 mil grid-cathode spacings obtainable in these structures, prohibits wide-bandwidth as an amplifier characteristic because grid-cathode spacing controls the transit time of electrons flowing from the cathode past the grid(s) to the anode of each vacuum tube in the distributed amplifier. Second, when tubes include an integral grid or grids, Barium (Ba) from the tube's thermionic cathode migrates or evaporates, during tube operation, from the cathode onto insulation layers separating the grids from the Bariated cathode and, as a result, the grids are shorted out. Third, low current densities available from thermionic cathodes employed in vacuum tubes, limited to less than 10 amperes per square centimeter ($A/cm^2$), do not allow microminiturization of the tubes themselves. Fourth, present vacuum tubes are inherently low reproducibility and high unit cost because they employ hand operations in fabrication.

Accordingly, there is a present need to design and fabricate distributed amplifiers that do not suffer from the problems outlined above. This need is met by this invention which employs for the very first time the technology of integrally gridded Field Emitter Arrays (FEAs), replacing gridded thermionic vacuum tubes and in a form which is susceptible to the same low cost reproducible manufacturing methods as exist in silicon integrated circuit manufacture and processing.

In contrast to the two forms of distributed amplifiers that have just been described, distributed amplifiers utilizing Field Emitter Arrays (FEAs) would offer wide bandwidth capability not attainable with semiconductor devices or with vacuum tubes. Such distributed amplifiers, moreover would be attractive for many technical application where said devices or said tubes can not be readily employed. The present invention is amenable to low cost and reproducible manufacture using existing microelectronics processing techniques. Furthermore, the vacuum aspects of the invention lie well within existing art. Distributed amplifiers although known for five decades, have never been built from Field Emitter Arrays for numerous reasons that would require a lengthly discussion here that would not serve a useful purpose. Primarily because of submicron and sub 1000 Angstrom (A) fabrication technology difficulties and for many other reasons, no one has yet fabricated a Distributed Amplifier made of any Field Emitter Array built by using integrated circuit technology despite the advantages that would accrue to the builder. Furthermore, such devices offer temperature ranges of operation not available to any known semiconductors; those semiconductors which can operate at high temperature, because of wide energy gaps, cannot operate significantly below room temperature because their donor and acceptor states are not shallow compared to kt, where T is the absolute temperature and k is Boltzman's constant.

Henry F. Gray and Richard F. Greene have been continuously active for many years in developing Field Emitter Array Technology and have made significant advances in this technology. They have sought ways to embed Field Emitter Arrays in Integrated Distributed Amplifiers, because there are inherent advantages to be gained through manufacture and utilization of such devices. Their efforts had met with little success until recently. Their success will soon be evidenced by new Distributed Amplifier products that will soon be introduced into the marketplace. Unpublished technical proposals indicating feasibility of demonstration projects involving Distributed Amplifier designs with embedded Field Emitter Arrays have been originated by Gray and Greene.

Gray and Greene have long recognized that it would be desirable to fabricate and provide an ultra-high frequency, wide bandwidth, integrated distributed amplifier based on field emitter arrays, because such amplifiers could be used, inter alia, for medium power amplification of microwaves, millimeter waves, and submillimeter waves. This patent specification represents a project to design and build distributed amplifier modules in accordance with design principles set forth herein.

Henry F. Gray, at the Ballistics Electrons for Transistors Conference held in Santa Barbara, Calif., on 23 March 1987, reviewed Field Emitter Array Electronics and dealt with concepts and applications, and dealt with Current Saturation in n-type Silicon Field Emitter Arrays. Presentations were given on 23 March 1987 by Henry F. Gray that related to the two topics just identified. Sketches of a proposed distributed amplifier were given out at said Conference when the basic concepts of the invention where made available to the public for the very first time. Gray presented these ideas to a technical audience at Hughes (EDD), Torrance, Calif. at their invitation after 23 March 1987.

SUMMARY OF THE INVENTION

An object of the invention is to provide one or more novel distributed amplifier modules.

Another object of the invention is to provide one or more novel distributed amplifier modules incorporating one or more field emitter cathodes.

Another object of the invention is to provide distributed amplifiers that incorporate field emitter cathode schemes.

An object of this invention is to provide ultra-high frequency, wide-bandwidth, integrated distributed amplifiers based on collections of field emitter cathodes which form field emitter arrays that assume various and sundry configurations within a generic format.

Another object of this invention is to provide amplifiers designed primarily for medium power amplification of microwaves, millimeter waves, and submillimeter waves, perhaps well above 1 terahertz (thz) (viz. 1–100 thz). These amplifiers are operable over a range of frequencies from essentially zero gahertz (DC) to above 1000 gigahertz (ghz) perhaps to 100 thz).

Another object of the invention is to provide integrated distributed amplifiers incorporating a field emitter cathode in a single or multiple cell-like amplifier.

One of the objects of the invention is to provide various forms of distributed amplifiers useful for ultra-high frequency, wide-bandwidth, device applications, with each such amplifier having one or more field emitter cathodes (arrayed in a random, pseudorandom, or ordered fashion) according to an underlying design principle that weds respective cathodes to amplifier cells and to transmission lines to form a modular distributed amplifier.

Another object of this invention is to provide amplifiers which operate at high efficiency by virtue of needing no thermionic heat power supplies, as in TWTs, and by virtue of avoiding all ohmic power losses in the interaction region, as compared to solid state power amplifiers.

Another object of this invention is to provide power amplifiers which avoid the cathode heat-up and cathode reactivation delays well known in the arts of TWT satellite communication and microwave TWT decoy systems associated with domant storage.

Other objects, advantages, and features of the invention are disclosed in the detailed description of numerous invention embodiments considered together with the accompanying drawings depicting some (but not all) embodiments of the invention.

The invention provides a distributed amplifier module comprising one or more field emitter cathodes, one or more grids, and one or more anodes forming one or more amplifier cells (components) in a monolithic, integrated circuit module. Distributed capacitive impedances and distributed inductive impedances, interconnected into an impedance network, form stripline-like transmission lines running through the one or more cells. The one or more cells are embedded within the lines with one or more cathodes embedded in a line acting as an input line, and with one or more of the anodes embedded in a line acting as an output line. The cathode and the grid(s) form a cathode-grid region. Electrons travel from the one or more cathodes past the one or more grids to the one or more anodes when a wave signal propagating through the input line flows across one or more cathode-grid regions defined by the one or more cathodes and the one or more grids.

The invention provides an integrated circuit having spaces that can, but need not, be evacuated, in a modular structure forming a distributed amplifier in which amplifier cells contain field emitter cathodes, in which impedances interconnect cathode-grid regions of respective amplifier cells, in which impedances interconnect grid-grid regions and grid-anode regions of amplifier cells, in which one or more grids is interposed between cathode and anode·of each amplifier cell, in which amplifier cells form a cathode-cathode chain and a grid-grid chain to approximate an integrated structure resembling a stripline-like transmission line (sometimes called a "quasi-waveguide"), in which amplifier cells form a grid-grid chain and an anode-anode chain to approximate an integrated structure resembling a stripline-like transmission line (sometimes called a "quasi-waveguide"), in which cathode-cathode, grid-grid, and anode-anode chains are embedded in and are part of transmission lines containing amplifier cells, and in which the aforesaid spaces can, but need not, be evacuated. Amplifier cells whose cathode-grid regions, grid-grid regions (optional) and grid-anode regions collectively form part of a distributed amplifier module comprise single or multicell devices. (Single cell devices are also within the scope of the invention.)

All of the cathodes, grids, anodes, and interconnections between cathodes, between grids, and between anodes are made of electrically conductive (low resistance) material. All of the impedances are configured to form phase velocity matched companion transmission lines or "quasi-waveguides" where amplifier cells of a distributed amplifier are located to form a collection of amplifier cells dotting an expanse of companion transmission lines. All of the aforesaid circuit components are integrated into a distributed amplifier in a single circuit module. (Single-cell devices are also within the scope of the invention.)

The invention provides one or more field emitter cathodes, e.g., one or more sources of electrons at points, edges, lines, curves, arcs, spirals, meanders, etc. embedded within a transmission line-like structure wherein electromagnetic waves, namely an input wave and an output wave, traveling in companion transmission lines, encompassing amplifier cells, remain in constant or near constant phase relation to each other and are effectively electron coupled at amplifiers cells so that both waves travel at a common average phase velocity through the transmission lines and the amplifier cells. The waves thereby remain or almost remain in phase while the input wave in one transmission line accompanies an output wave in another line which output wave emerges from the devices as an amplified replica of the input wave. These distributed amplifiers have one or more amplifier cells comprised of three or more electrodes: an electron source or cathode; a gate or grid; additional gates or grids if desired; a drain or anode; and in some instances, additional anodes. In some instances where an apertured anode having a set of anode apertures is used rather than an ordinary (apertureless) anode, a collector anode is added to form a device that will display very high device efficiency due to a slow down of the velocity of electrons spawned at a cathode as the electrons pass through anode apertures to reach the collector anode where the electrons return kinetic energy to the power supply. This is called use of a "depressed collector".

Devices embodying the invention have common structural features, namely, one or more sharp, microsized electron-liberating field emitter cathodes (which may, but need not, be made of known electron-emissive materials, e.g. BaO) and which may form a random, pseudo-random, or ordered cathode array bestudding transmission lines in a distributed amplifier module, one or more grids, and one or more anodes. Various cathode, grid and anode electrodes are stacked to somewhat resemble conventional vacuum tubes (e.g., triodes pentodes) or symmetrically arranged where no traveling waves are processed as they are in distributed amplifiers embodying this invention.

Three-dimensional (3-D) or two-dimensional (2-D) devices are suited for application as distributed amplifiers, depending on the chosen device design, and are exemplified in this specification. Each and every one of the devices is designed to accept an input wave signal that travels from one device end through the device across one or more electron-liberating field emitter cathodes to arrive at a device end in the same amount of time that an output signal travels through the device sometimes, but not always, in synchronism with the input signal passing through an amplifier cell or successive amplifier cells to emerge from the device at the same time that the input signal emerges from the device.

A clear understanding of the invention vis-a-vis the prior art can be gained by the following discussions of the Figures of the drawings.

BRIEF DESCRIPTION OF THE PREFERRED EMBODIMENTS

Figure 1:
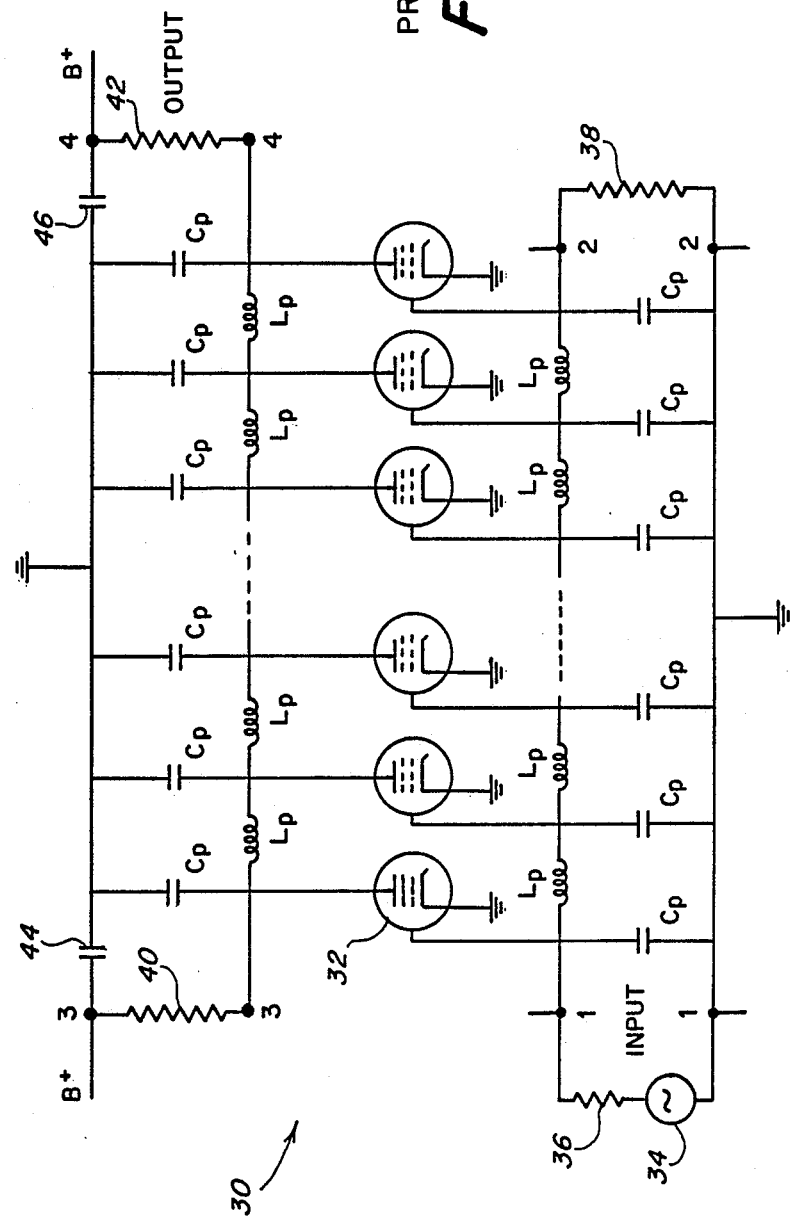
FIG. 1 is a circuit diagram of a typical distributed amplifier of the prior art.

Referring now to FIG. 1, a distributed amplifier 30 shown in schematic form in FIG. 1 represents "prior art" amplifiers employing vacuum tubes 32 having appropriate spatial distribution along lumped-sum artificial transmission lines. The schematic of FIG. 1 looks like the Basic Distributed Amplifier shown in FIG. 1 of the Ginzton et al. Article. Amplifier 30 has a limited number of discrete tube amplifiers 32 combined with a impedance network approximating transmission lines composed of a limited number of reactive impedances. Amplifiers 32 are tetrodes that have a thermionic cathode, two grids, and an anode. The two grids are located between the thermionic cathode (connected to ground) and the anode (connected to a B+ power supply). Grid-cathode capacitances $C_g$ provide capacitive impedances $-i/w\ C_g$ coupled from the grids closest to the tube cathodes to ground. (Neither $L_g$ nor $C_g$ are specifically illustrated in FIG. 1.) Grid inductances $L_g$ provide inductive impedances $+iw\ L_g$ coupled between grids closest to the tube cathodes. Reactive impedances determined by capacitances $C_g$ and inductances $L_g$ form an artificial transmission line adapted to receive an input wave signal. Plate capacitances $C_p$ determine capacitive impedances coupled from tube anodes to ground. Plate inductors $L_p$ determine inductive impedances coupled between tube anodes. Reactive impedances defined by capacitances $C_p$ and inductances $L_p$ form an artificial transmission line adapted to carry an output wave signal.

A signal source 34 coupled via a resistor 36 to a pair of input terminals (1,1) introduces a wave signal into the artificial transmission line comprised of a network of elements $C_g$ and $L_g$ followed by a pair of output terminals (2,2) connected to a resistive terminating impedance 38.

An output signal starting out at a pair of input terminals (3,3) and a resistor 40 propagates through the artificial transmission line comprised of a network of elements $C_p$ and $L_p$ followed by a pair of output terminals (4,4) and a resistive load impedance 4. Capacitors 44 and 46 at opposite ends of amplifier 30 are interposed between a B+ power supply and elements $C_p$. Capacitors 44 and 46 serve as d.c. isolating capacitors. The operation of amplifier 30 need not be explained because it is evident to anyone conversant with distributed amplifiers.

Figure 2:
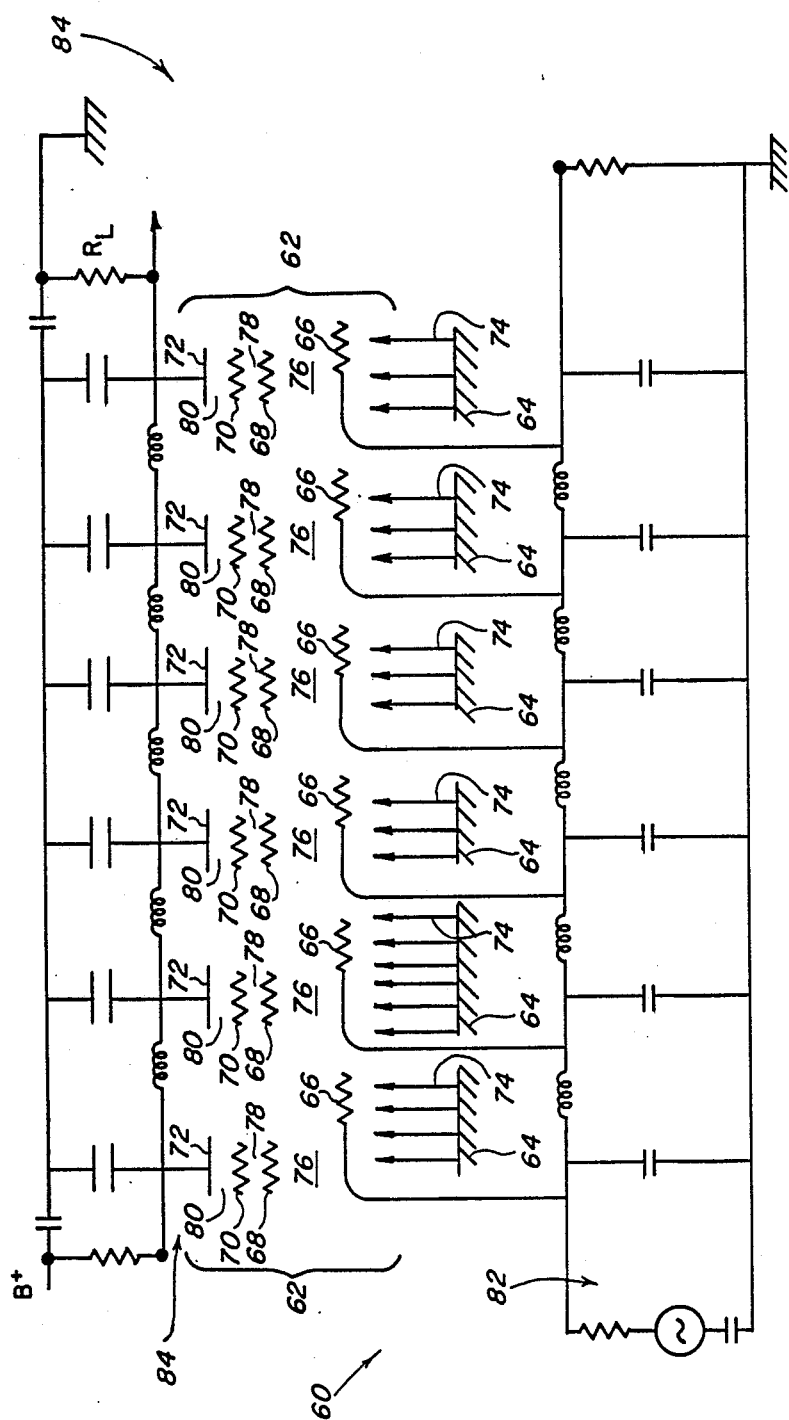
FIG. 2 is a circuit diagram of a unique distributed amplifier affording one example of the various and sundry distributed amplifiers made available by the invention.

Referring now to FIG. 2 a basic distributed amplifier 60 that represents one embodiment of the invention is illustrated in a schematic form in FIG. 2. Amplifier 60 is an integrated circuit composed of a host of amplifier cells 62 in a multiple waveguide transmission line that encompasses a host of grid capacitances $C_g$, a host of grid inductances $L_g$, a host of anode capacitances $C_a$, and a host of anode inductances $L_a$. ($C_g$, $C_a$, $L_g$, and $L_a$ are not shown in FIG. 2.) Cells 62 are composed of a host of field emitter cathodes 64, a host of primary grids 66, a host of secondary grids 68, a host of tertiary grids 70 and a host of anodes 72. Various distributed inductances and capacitances, and amplifier cells 62 are connected into a single circuit forming a network of cells 62 populating a multiple distributed transmission line structure where cells 62 constitute part of a single distributed amplifier 60.

Only six amplifier cells 62 are shown in FIG. 2 whereas the actual number of cells is ordinarily a large number, more than a plurality or a "bunch", (i.e. a host) determined by the circuit designer and the needs to be met. When the number of amplifier cells is exceedingly high they are said to form an "amplifier sea" of extremely small sized amplifiers in a transmission line matrix. The number of cells can become exceedingly high, and then each cell can become infinitesimally small, such that individual capacitances and inductances can not be distinguished one from another in similarity to the mathematical transition from summation to integration.

Each cell 62 has a number of cathodes 64, an anode 72 and a cathode-anode path close to but not intercepted by three grids 66, 68, and 70 (in this instance). The three grids 66, 68, 70 divide empty space between cathode 64 and anode 72 into four separate regions: a cathode-grid region 4, a grid-grid region 76, a grid-grid region 78 and a grid-anode region 80. The four regions sustain vacuums or "quasi-vacuums" hence the mean free path of electrons traversing the regions is greater than the electron path length from cathode to anode. The regions contain a vacuum but could contain a low pressure gas, as a matter of choice. In this example, they are evacuated spaces made to sustain a vacuum which can be produced via a vacuum pump and/or a "getter" system. Cathode-grid regions 74 together with grid inductances $L_g$ and grid capacitances $C_g$ form an input transmission line 82. Grid-anode regions 80 together with anode inductances $L_a$ and anode capacitances $C_a$ form an output transmission line 84.

Cathodes 64 are all field emitter cathodes. They are shown as sharp pointed cathodes in FIG. 2 but could be shown as sharp-edged ridge cathodes or sharp-edged "razor blade" cathodes because both point-like or edge-like cathodes perform as efficient field emitter electron sources.

Operation of distributed amplifier 60 is like that of other distributed amplifiers except that the field emitter cathodes utilized in amplifier 60 have a profound effect on results obtained.

When an input signal of electromagnetic wave energy arrives at any cathode-grid region 74 within a sea of such regions the electric field signal of proper sign causes a nearby field emitter cathode 64 to emit a packet of electrons into region 74 in which they traverse before they travel through grid-grid region 76, grid-grid region 78 and grid-anode region 80 to reach nearby anode 72. Anode 72 collects the electrons and is sometimes called a collector anode to differentiate this anode from an anode that does not collect electrons but, instead, lets electrons penetrate the anode on their way to a collector anode and provides an inductive response to the electron current. These electrons reach anode 72 in a short time when the input signal is centered on a cathode-grid region 74 before passing on to another such region. Electron flow from a cathode to an anode ceases when a positive input signal peak (i.e. high electric field of proper direction and sense) departs from a cathode-grid region 74 to travel to an adjacent cathode-grid region 74 where electron flow also begins with the arrival of the signal peak and ends with the departure of the peak. The input signal peak proceeds from cathode-grid region to cathode-grid region over and over causing spatially distributed electron flows in a time sequence synchronized with propagation of the signal peak through successive cathode-grid regions.

An output signal is inductively generated in distributed amplifier 60 as the input signal travels through successive cathode-grid regions 74. This output signal proceeds through the output line and emerges from amplifier 60. The output signal gets stronger and stronger as each cell 62 contributes to an amplification process that "ties" the output signal to the input signal at the cells 62 each time electrons travel from cathode to anode.

Amplifier cells 62 form a collection of cells in an amplifier sea within a dual-transmission line structure. The wavelength of the input signal can vary over a wide range because the structure forms a broadband distributed amplifier determined primarily by the transmission line characteristics. The input signal typically may contain electromagnetic energy waves of differing wavelengths and yet amplifier 60 will amplify each and every electromagnetic wave within the input signal. Amplifier 60 can handle microwaves, millimeter waves and submillimeter waves.

The output line may be isolated from the input line (except for the electron current), or may be coupled through use of several feedback loops, continuous, tunable, or descrete, well known in the art of waveguide technology.

It should be clearly understood that FIG. 2 is diagrammatic in nature and does no more than begin to reveal the nature of the invention. FIG. 2 seemingly shows cells 62 that are uniformly spaced but in reality the invention does not dictate or require uniformly spaced amplifier cells. The invention contemplates the use of nonuniformly spaced amplifier cells as well as uniformly spaced amplifier cells. Furthermore, these amplifier cells can be arrayed in a random, pseudorandom, or ordered fashion. The use of continuous amplifier cells in which there are no spaces, e.g. no lumped circuit elements, is also contemplated.

Perhaps one can better understand the invention by considering an input signal composed of five electromagnetic waves of five different wavelengths where one wavelength is such that wave amplification occurs in only sixty amplifier cells 62, where another wavelength is such that wave amplification occurs in only thirty amplifier cells 62, where still another wavelength is such that wave amplification occurs in only twenty amplifier cells 62, where yet another wavelength is such that was amplification occurs in only ten amplifier cells 62, and where still another wavelength is such that wave amplification occurs in only five cells 62 because the five wavelengths correspond to five distances inversely proportional to the number of amplifiers 62 where the wave peaks coincide with the placement of a field emitter cathode 64.

A clear understanding of the broad nature of the invention may be gained by reference to FIGS. 3–26 which relate to various distributed amplifier structures having any number of field emitter cathodes that are configured in accordance with the teachings of the invention.

Figure 3:
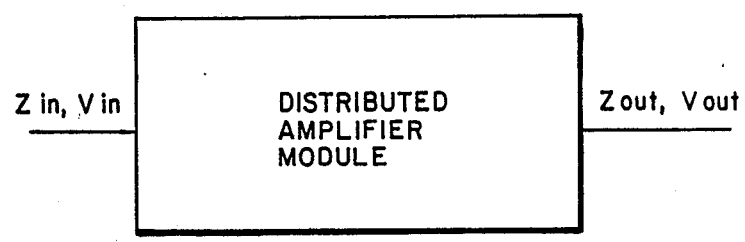
FIG. 3 is a simple block diagram of a distributed amplifier module provided by the invention.

Referring now to FIG. 3, the shown distributed amplifier (DA) module represents the various embodiments of the invention that may result when the teachings of the invention are followed. The module contains a distributed amplifier that has an input impedance $Z_{in}$ and an output impedance $Z_{out}$ and a signal gain G so that an input signal $V_{in}$ results in an output signal $V_{out}$ equal to $V_{in} \times G$. FIG. 3 emphasizes that integral, modular construction of the distributed amplifier is a key design feature. Other Figs. emphasize that the distributed amplifier may incorporate any number of field emitter cathodes that can assume any number of shapes provided that each cathode that is incorporated into a design produces a sharply defined electron stream from cathode to anode in the module.

Figure 4:
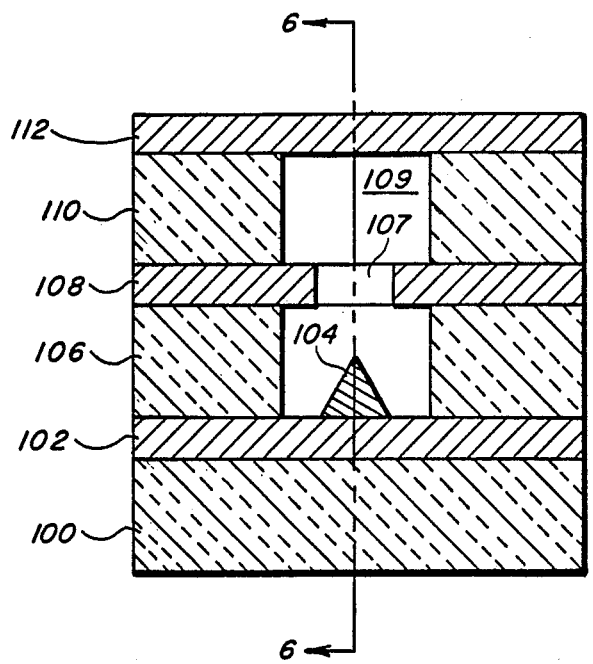
FIG. 4 is a cross-sectional view of a distributed amplifier module incorporating a single wedge-like field emitter cathode, a grid, and an anode.

Referring now to FIG. 4, the shown distributed amplifier (DA) is illustrative of but one of many possible embodiments of the invention. The DA includes a substrate 100, made of dielectric, or semiconductor, such as alumina, or silicon, or superconductor, or any other material suitable for a substrate. An electrically conductive film 102 located on top of substrate 100 acts as an electrical contact to a wedge-like field emitter cathode 104 located on top of conductive film 102. Dielectric film material 106 located on conductive film 102 has a slot formed therein where cathode 104 sits. Electrically conductive thin film material 108 located on top of dielectric material 106 acts as a grid having a grid slot 107 formed therein that lies directly over cathode 104. Dielectric film material 110 located on top of conductive film material 108 has a grid slot 109 formed therein that overlies the cathode 104. Electrically conductive film material 112 located on top of dielectric material 110 acts as an anode located above the cathode 104 where the anode 112 can catch electrons sent to the anode by cathode 104.

Cathode 104, grid 108, and anode 112 form a triode-like amplifier cell embedded within a pair of companion stripline-like transmission lines including an input line located below an output line. The input line (not labelled) includes the conductive film materials 102 and 108. The output line (not labelled) includes the conductive film materials 108 and 112.

Still referring to FIG. 4, successive sections of the input line and the output line have associated distributed capacitance values and distributed inductance values such that the average velocity of an inputwave signal in the input line matches the average velocity of the output signal in the output line. As a result, the cathode-anode current that flows in any of the successive sections is spatially distributed in accordance with the wavelength of the input signal. Since the wedge-like cathode 104 can emit electrons anywhere along the length of the wedge the positions of the positive peaks of the input signal propagating in the input line dictate where and when cathode-anode current flows from a designated cathode section.

Still referring to FIG. 4, it is seen that one grid is interposed between the cathode 104 and the anode 112 in the exemplary distributed amplifier, which obviously contains only a single triode-like amplifier cell. Two grids could be interposed between cathode and anode if a tetrode-like amplifier cell is desired. Three grids could be interposed between cathode and anode when a pentode-like amplifier cell is desired.

Figure 5:
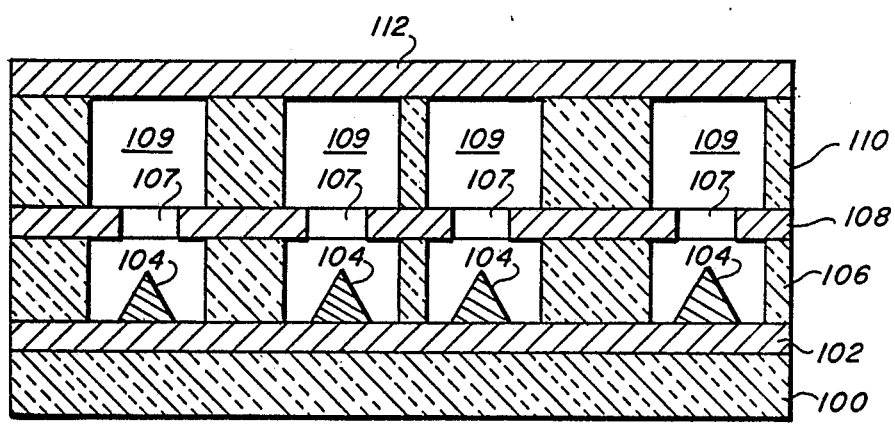
FIG. 5 is a cross-sectional view of a distributed amplifier module incorporating a series of wedge-like field emitter cathodes, a series of grids, and an anode.

Referring now to FIG. 5, the shown distributed amplifier includes a substrate 100, a conductive film 102, cathode 104, dielectric film material 106, a conductive film 108, a dielectric film material 110, and a conductive film 112 similar to like parts of FIG. 4 but differing from the FIG. 4 structure in having a plurality of amplifier cells similar to the single cell shown in FIG. 4. The cells are coextensive in volume with a pair of stripline-like transmission lines including an input line having conductive film material 108 acting as a grid, conductive film materials 102 and 108 defining the lower and upper boundaries of the input line, and conductive film material 108 and 112 defining the lower and upper boundaries of the output line. Accordingly, FIG. 5 shows four cells, one input line, and one output line. The four cells are nonuniformly spaced apart. Wave flow follows the length of a wedge cathode 104. (Wave flow could follow a path crossing successive wedge cathodes with each wedge cathode approximately a point cathode in the path).

Figure 6:
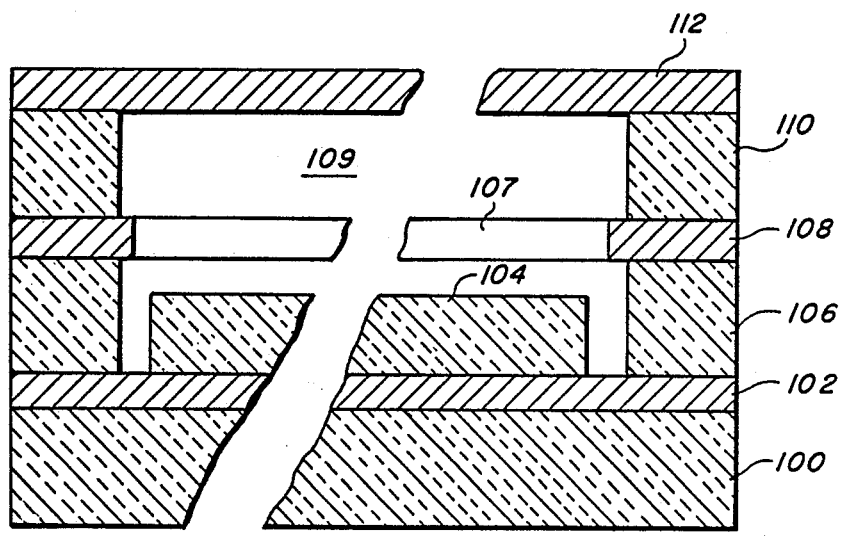
FIG. 6 is a cross-sectional view of a distributed amplifier module incorporating a single wedge-like field emitter cathode, a grid, and an anode; the view being taken in the direction A of FIG. 4.

Referring now to FIG. 6, the shown distributed amplifier module is identical to the one shown in FIG. 4 except that the elevational view of FIG. 6 is taken along direction 6—6 of FIG. 4. Like elements in FIGS. 4 and 6 are identically numbered. The wedge-like cathode shown in both Figures is quite long in comparison to the cathodes's width. The leftmost end and the rightmost end of the device are shown but the centermost part of the device has been omitted because the cathode length is drawn somewhat to scale. The wedge length can be aribitrarily chosen. The amplifier cell length is comparable to the length of the companion stripline-like transmission lines running from left to right across the module. The shown module is a linear device with the wedge cathode 104 approximating a series of wedgelet cathodes laid end to end in a straight row wherein each wedgelet cathode is contiguous to another wedgelet cathode, speaking conceptually.

Figure 7:
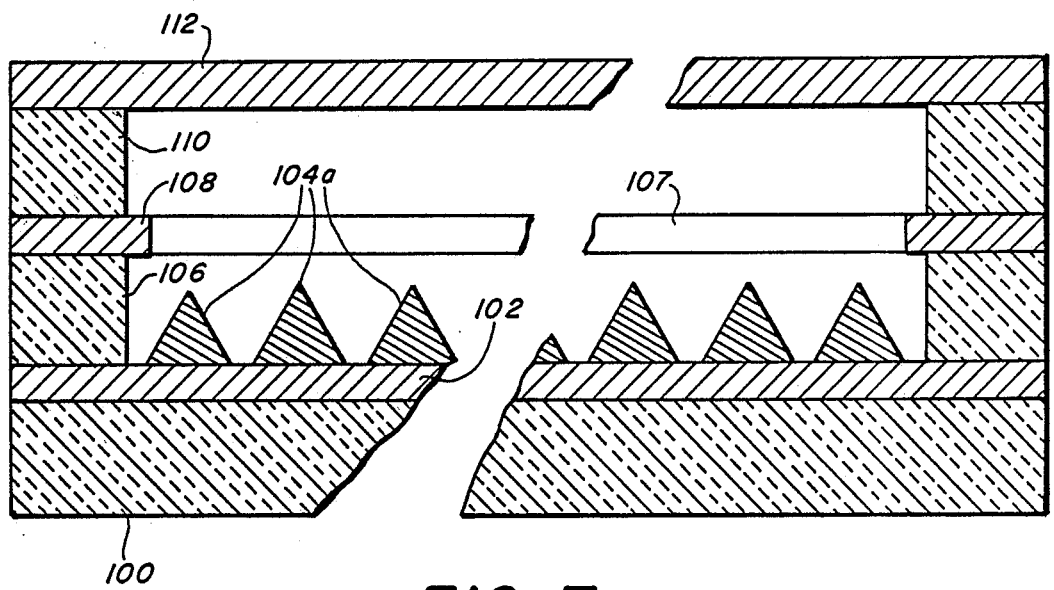
FIG. 7 is a cross-sectional view of a distributed amplifier module incorporating a series of point-like field emitter cathodes, a grid, and an anode.

Referring now to FIG. 7, the shown distributed amplifier module is similar to the one shown in FIG. 6 except a row of point-like cathodes 104a is substituted for the single wedge cathode 104 shown in FIG. 6. Otherwise, the two modules are identical and identical numbers are given to like parts in the two Figs. The series of cathodes 104a shown in FIG. 7 are spaced apart from each other and are not contiguous. Cathodes 104a are connected in series-like fashion by the conductive film 102 on the substrate 100 which need not be conductive enough to perform the cathode-connecting function performed by the conductive film 102.

Figure 8:
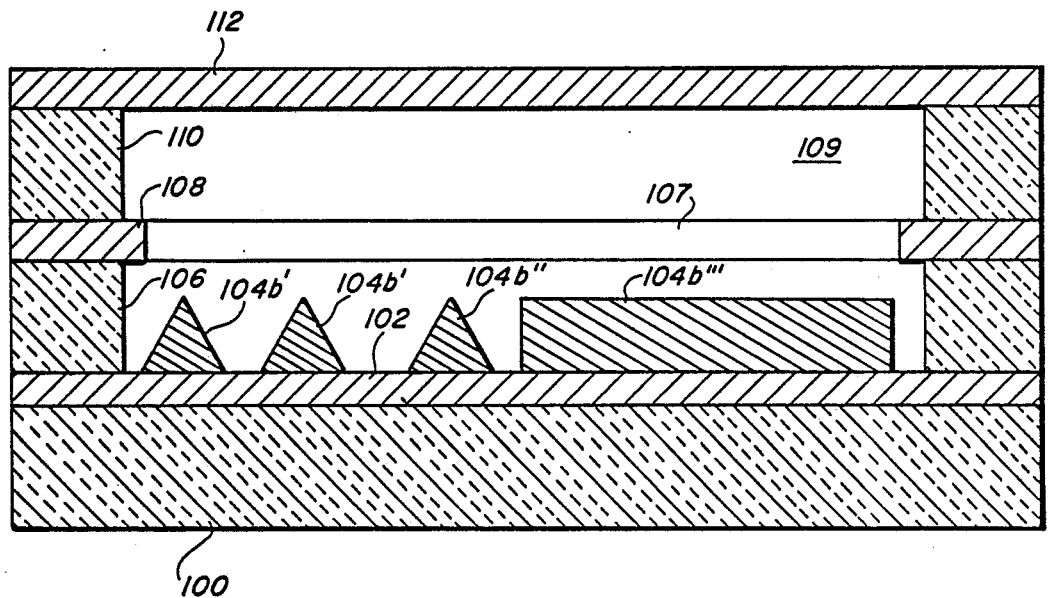
FIG. 8 is a cross-sectional view of a distributed amplifier module incorporating a series of point-like cathodes and wedge-like cathodes, a grid, and an anode.

Referring now to FIG. 8, the shown structure illustrates another distributed amplifier constituting still another embodiment of the invention. The structure includes a substrate 100 made, for example, of dielectric material. A conductive film 102, made, for example, of metal (e.g., aluminum) contacting the uppermost surface of the substrate as shown. A set of field emitter cathodes 104b is located on the conducting film. The cathodes are nonuniformly spaced apart Two cone-like cathodes 104b' and a pyramidal cathode 104b'' and a wedge-like cathode 104b''' are shown in FIG. 8. These cathodes represent a larger number of such cathodes that may be located in a row in any given distributed amplifier. FIG. 8 really illustrates that cathodes of a variety of shapes can be spaced along a line, (straight or curved) with neighboring cathodes spaced apart, as is the case here where point-like cathodes are shown at the left in FIG. 8. In the case of a series of wedgelet-like cathodes combining into a single wedge-like cathode as shown at the right in FIG. 8 the wedgelet-like cathodes are contiguous cathodes.

Still referring to FIG. 8, a dielectric thin film material 106, such as alumina, located on conductive film 102 contains a slot in which the cathodes are located. A conductive (metal) film 108 located on dielectric film material 106 contains a slot located near the peaks of the cathodes 104b on the conductive film 102b which is a substrate 100. A dielectric film material 110, such as alumina, located on conductive film 108 contains a slot located above the peaks of the cathodes 104b. A conductive film 112 located on dielectric film material 110 runs across the underlying structure.

The FIG. 8 structure forms a cathode-grid-anode structure that defines an amplifier cell (or a series of such cells) in a pair of transmission lines running from left to right in FIG. 8. The cathode-grid region(s) defined by the cathodes 104b and the grid 108 is an integral part of an input transmission line formed by conductive films 102 and 108 and material 106. The anode-grid region(s) defined by the anode 112 and the grid 108 is an integral part of an output transmission line formed by conductive films 112 and 108 and material 110.

Figure 9:
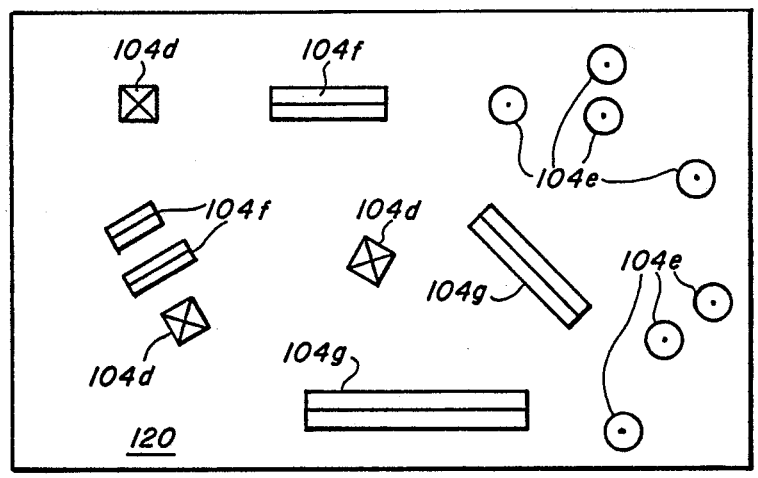
FIG. 9 is a plan view of a part of a distributed amplifier module wherein field emitter cathodes are random in position, size, direction, and configuration.

Referring now to FIG. 9, the structure shown represents a distributed amplifier that will be described, and that falls within the scope of the invention, whether or not described in this specification. As should now be quite clear, a distributed amplifier provided by the invention always has a field emitter cathode, a grid, an anode, input line and an output line, and may have any number of such cathodes, any number of grids, and any number of anodes, and may even have an infinite number of cathodes, grids, and anodes depending on the excercise of design choice.

FIG. 9 shows only a small part of a model distributed amplifier in which a variety of sharp microsized cathodes are shown. The grids and anodes that would accompany the cathodes in a complete distributed amplifier are not shown because it is desired to facilitate description of the cathodes and because the teachings of the invention set forth elsewhere in this specification will enable a skilled workman to build complete distributed amplifiers incorporating these cathodes One can regard FIG. 9 as offering a conceptual framework for a description providing a fuller and more comprehensive understanding of the nature of the invention.

Again referring now to FIG. 9, the structure shown can be seen to include a substrate 120 having the basic function of providing a foundation for the remainder of a distributed amplifier module. Since the substrate can be turned upside down the substrate need not always be lowermost in a module. For ease of description it is convenient to consistently refer to a substrate as a module element.

Still referring to FIG. 9, the structure shown can be seen to include a variety of sharp field emitter cathodes 104d, 104e, 104f, 104g, located directly upon a major flat surface of substrate 100. A variety of cathode shapes on a single substrate is a key feature of the structure. This variety is illustrated to dispel any notion that any distributed amplifier within the scope of the invention must have uniformly shaped cathodes (when more than one cathode is present in a particular device) and uniform features.

Still referring to FIG. 9, the shown structure includes a finite number of sharp cathodes that form a pattern of cathodes only because there are a number of cathodes incorporated into the structure. In other words, the pattern of shown cathodes is a totally random pattern in theory (if not in fact) and any order or regularity to the pattern is, (in this instance at least) purely accidental and unintended. There appears to be plenty of clear substrate surface not located beneath a cathode. This circumstance is not accidental but planned, in order to dispel any notion that the invention requires that the cathodes must necessarily be crowded together into an ordered or dense cathode array covering almost all of the substrate major surface.

Still referring to FIG. 9, the shown structure includes a number of pyramid-like cathodes 104d representing a larger number of such cathodes, a number of cone-like cathodes 104e representing a larger number of such cathodes, a number of wedgelet-like cathodes 104f representing a larger number of such cathodes, and a number of wedge-like cathodes 104g representing a larger number of such cathodes. The wedgelet-like cathodes 104f are analogous to short wedge-like cathodes while, by the same token, the wedge-like cathodes 104g are analogous to a large number of wedgelet-like cathodes laid end to end to form a single long to very long cathode.

Still referring to FIG. 9, the shown cathodes are nonuniform in height (although not evident from the plan view of FIG. 9) to dispel any notion that the cathodes must be of uniform height.

Still referring to FIG. 9, the various cathodes 104d-g are shown to be random in position, in size, and in direction (in the instance of cathodes, e.g. wedge, wedgelet that are asymetric rather than symetric e.g. cones, pyramids. All of the cathodes that are shown have in common the fact that they have microsized points or edges that poke out toward a region into which electrons are discharged as they travel through or past one or more grids, and possibly one or more anodes before arriving at an anode where they contribute to the cathode-anode current of a cell-like amplifier in a manner that typifies a modular distributed amplifier.

Still referring to FIG. 9, the various cathodes have in common the fact that each and every one has a peak having a sharp aspect to it so that the sharpness of the peak contributes to an efficient flow of electrons in a distributed amplifier cell at the sites of the cathode or cathodes whose positions coincide with the positions of positive peaks of wave signals passing through the input line of a distributed amplifier.

Figure 10:
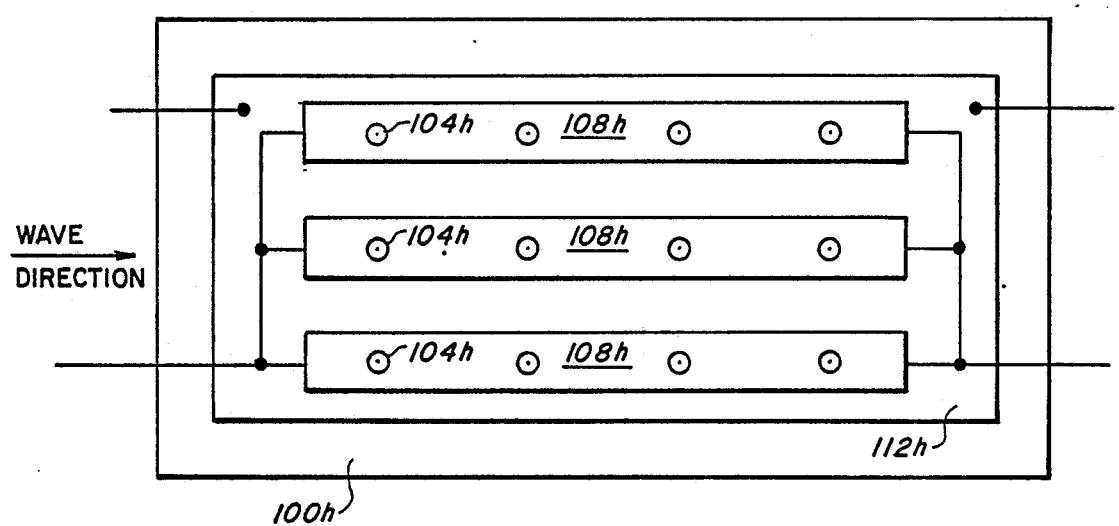
FIG. 10 is a plan view of part of a distributed amplifier module incorporating rows of point-like field emitter cathodes, grids, and an anode.

Referring now to FIG. 10, the shown structure illustrates yet another distributed amplifier that may be provided in accordance with the invention. FIG. 10 is conceptual in nature and is not an accurate rendition of an actual device. In this example, a distributed amplifier is comprised of a substrate 100h, three rows of uniformly paced cone-like cathodes 104h, three long grids 108h, and a single plate-like anode 112h. Wave direction relative to the device of FIG. 10 is indicated by an arrow at the left side of the structure indicating that wave direction is the same as the direction of the cathode rows and the grids 108h overlying the cathode rows. The cathodes 104h are integral extensions of the underlying substrate which is by itself sufficiently conductive, even though made of semiconductive material (e.g. silicon) which may be doped to make the material even more conductive than would otherwise be the case. The grids 108h are separated from the cathodes 104h and the anode 112h by dielectric film material in a manner evident from the balance of this specification. Wave direction is from left to right. The substrate, cathodes, grids, and anodes are shown as "transparent" materials to aid observation of these cell components. Input connections are shown at the left, and output connections are shown at the right. The group of cathodes, grids and anodes are embedded in companion transmission lines including an input line and an output line.

Figure 11:
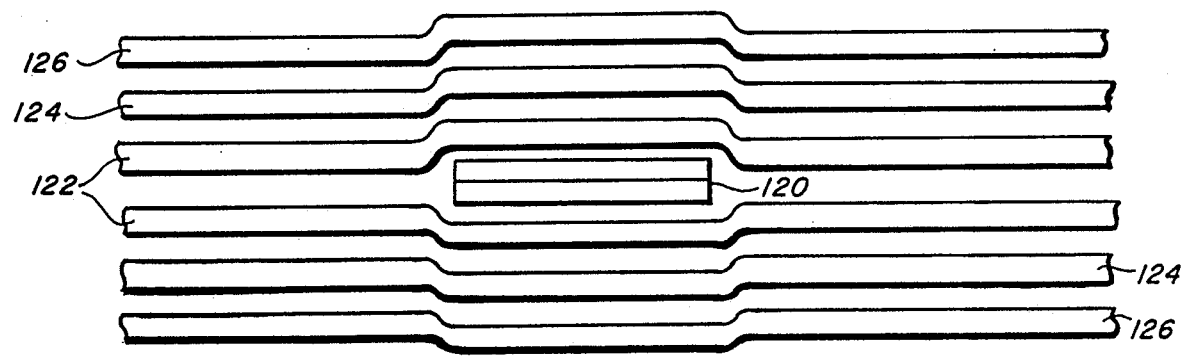
FIG. 11 is a plan view of part of a distributed amplifier module incorporating a wedge-like field emitter cathode, grids, and an anode.

Referring now to FIG. 11, the shown structure represents a distributed amplifier module wherein a wedgelet-cathode 20 on a substrate (not shown) is flanked by a two-part grid 122 running from left to right, a two-part grid 124 running from left to right, and a two-part anode 126 running from left to right. The structure is symmetrical about cathode 120, and is comprised of cell components that are not stacked as was the case in exemplary modules already discussed. The shown structure also represents an elongated input transmission line running from left to right that include a strip of substrate that runs between the inside two part grid 12 and ground. The shown structure also represents an output transmission line running from left to right that includes the outside, two part anode 126, and ground. Center rails, or ridges (middlemost grid) 124 are for isolation of input from output. As seen by inspection of FIG. 11, each of members 122, 124, and 126 are in the form of rails, or ridges. Dielectric material (not shown) underlies the grids 122, 124 and the anode 126. The wedgelet cathode 120 is embedded in the input line and runs but a short distance along the line. The transmission lines have spatially distributed inductances and capacitances that ensure that the average velocity of an input wave signal traveling in the input line matches the average velocity of an output wave traveling in the output line. Inductance values depend on the shape, size and location of the conductive material comprising the grids 122 and 124 and the anode 126. Capacitances values depend on the shape, size, material composition, and location f the dielectric material between the cathode 120 and substrate, between substrate and grids 122, between the substrate and grid 124, and between the substrate and anode 126, and on the dielectric constant of the particular dielectric that is used. Variations of the basic structure will suggest themselves to one skilled in the applicable technology. The dielectric constant can be varied by varying the composition and/or amount of the dielectric material in the transmission lines.

Figure 12:
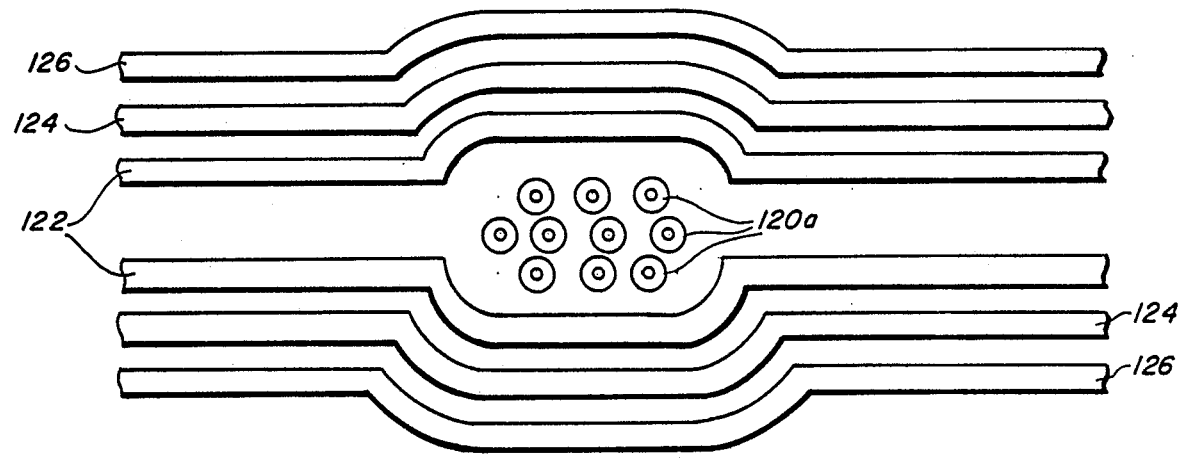
FIG. 12 is a plan view of part of a distributed amplifier module incorporating a cluster of point-like field emitter cathodes, grids, and an anode.

Referring now to FIG. 12, the shown structure represents a distributed amplifier module quite similar to the one shown in FIG. 11 except that a group of point-like field emitter cathode 120a replaces the wedgelet cathode 120 shown in FIG. 11. Identical numbers in the two Figs. are used to identify like parts. The group of cathodes 120a in the area shown in FIG. 12 do not necessarily occupy the positions shown and do not necessarily remain in spaced apart relation as shown. Some or all of the cathodes can touch other cathodes with little or no sacrifice of overall device efficiency.

The structure shown in FIGS. 11 and 12 suggest, as is indeed the case, that the distributed amplifiers of the invention need not be part of closed modules. An open module might work quite well in deep space (for example) where deep space acts as a dielectric medium that can conduct electrons from the cathode(s) to the anode of an amplifier cell incorporated into companion transmission lines.

Figure 13:
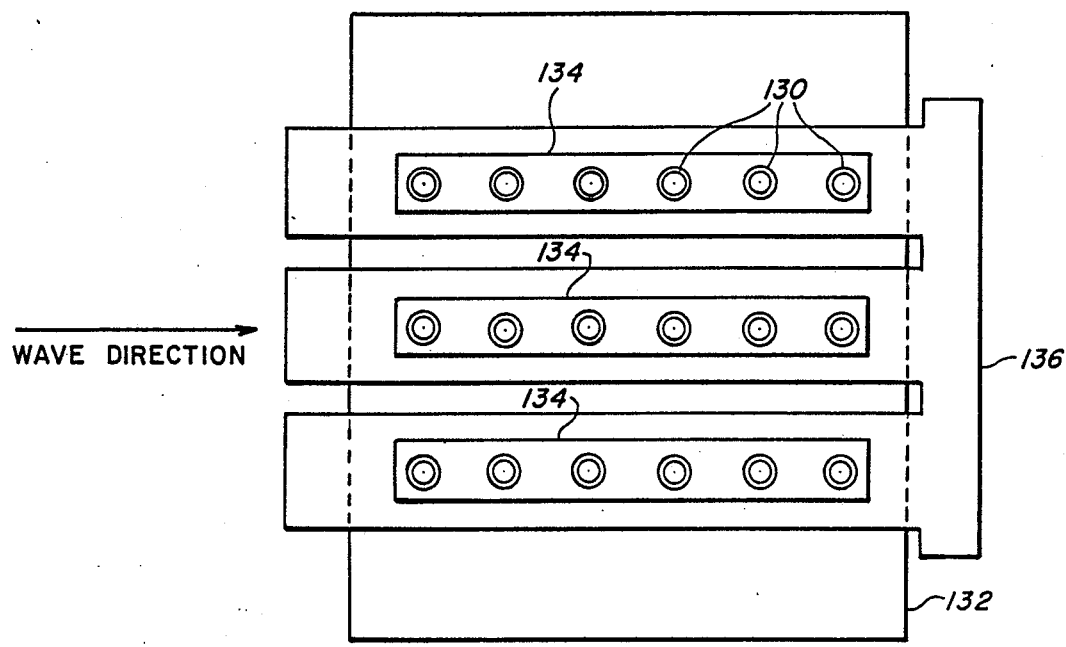
FIG. 13 is a plan view of part of a distributed amplifier module incorporating rows of point-like field emitter cathodes, grids, and an anode.

Referring now to FIG. 13. the shown distributed amplifier module includes three rows of point-like cathodes 130 on a substrate 132, three bar-shaped grids 134, and an anode 136 comprised of three bar-shaped anode portions interconnected at their rightmost ends by an anode bridge portion. Each cathode is a cone-like cathode having a peak that cones to a fine point and pokes upward toward anode 136 (as shown). Each grid has a tiny round circular aperture located above the point of an underlying cathode. Wave direction relative to the module is from left to right so that an input wave signal can flow between a grid and the cathodes of a cathode row before reaching the rightmost end of the module where an output signal is available between a bar-shaped anode portion and a grid. Eighteen amplifier cell sites can be designated (conceptually) in FIG. 13 since there are eighteen point-like cathodes spatially distributed in a companion stripline-like transmission line structure. Likewise, three amplifier cell sites can be designated (conceptually) in FIG. 13 since there are three rows of cathodes cooperating with three grids and three anode portions. FIG. 13 is a conceptual sketch in which there is no attempt to show solid dielectric materials that are an integral part of the transmission lines found in distributed amplifiers. There are instances when the dielectric material is not solid, but is a gas, a vacuum, or a liquid. The cathodes 130, grids 134 and anode 136 are shown as transparent elements for the sake of illustrating the module.

Figure 14:
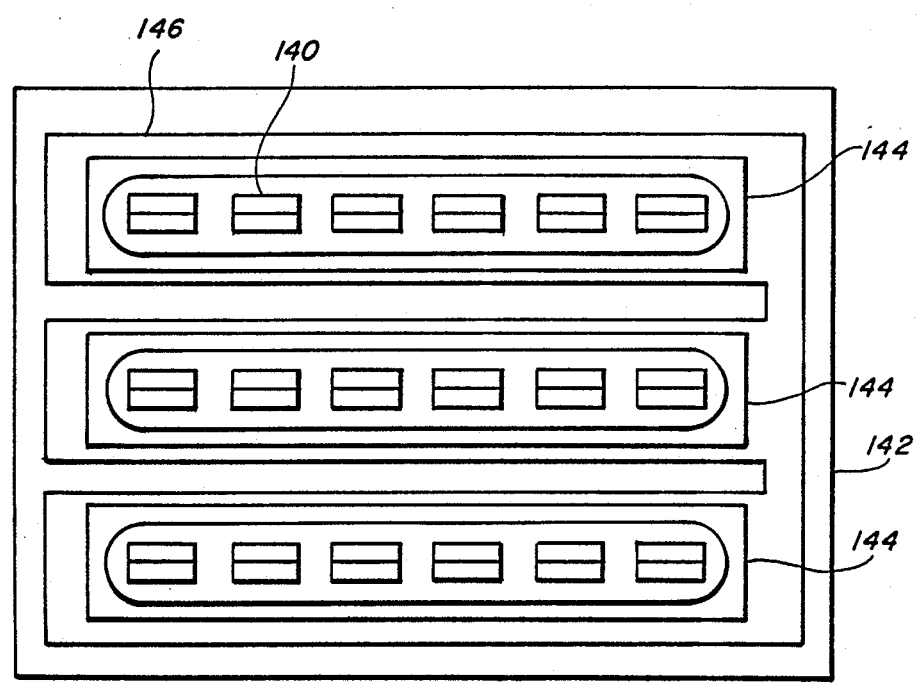
FIG. 14 is a plan view of part of a distributed amplifier module incorporating rows of wedge-like field emitter cathodes, grids, and an anode.

Referring now to FIG. 14, the shown distributed amplifier module includes three rows of wedgelet cathodes 140 on a substrate 142, three bar shaped grids 144, and an anode 146 comprised of three bar-shaped anode portions interconnected at their rightmost ends by an anode bridge portion. Each wedgelet cathode 140 forms a fine ridge line at its peak. Each grid 144 has a slot aperture located above a row of cathodes 140. Wave direction relative to the module is from left to right so that an input wave signal can flow between a grid and the cathodes of a cathode row before reaching the rightmost end of the module where an output signal is available between a bar-shaped anode portion or portions and a grid or grids. Eighteen amplifier cell sites can be designated (conceptually) in FIG. 14 since there are eighteen wedgelet cathodes spacially distributed in a companion stripline-like transmission line structure. Alternately, three cell sites can be designated (conceptually) in FIG. 14 since there are three rows of cathodes cooperating with three grids and three anode portions. FIG. 14 is a conceptual sketch in which there is no attempt to show dielectric materials that are an integral part of the transmission lines found in distributed amplifiers. The cathodes 140, grids 144 and anode 146 are shown as transparent elements for the sake of illustrating the module.

Figure 15:
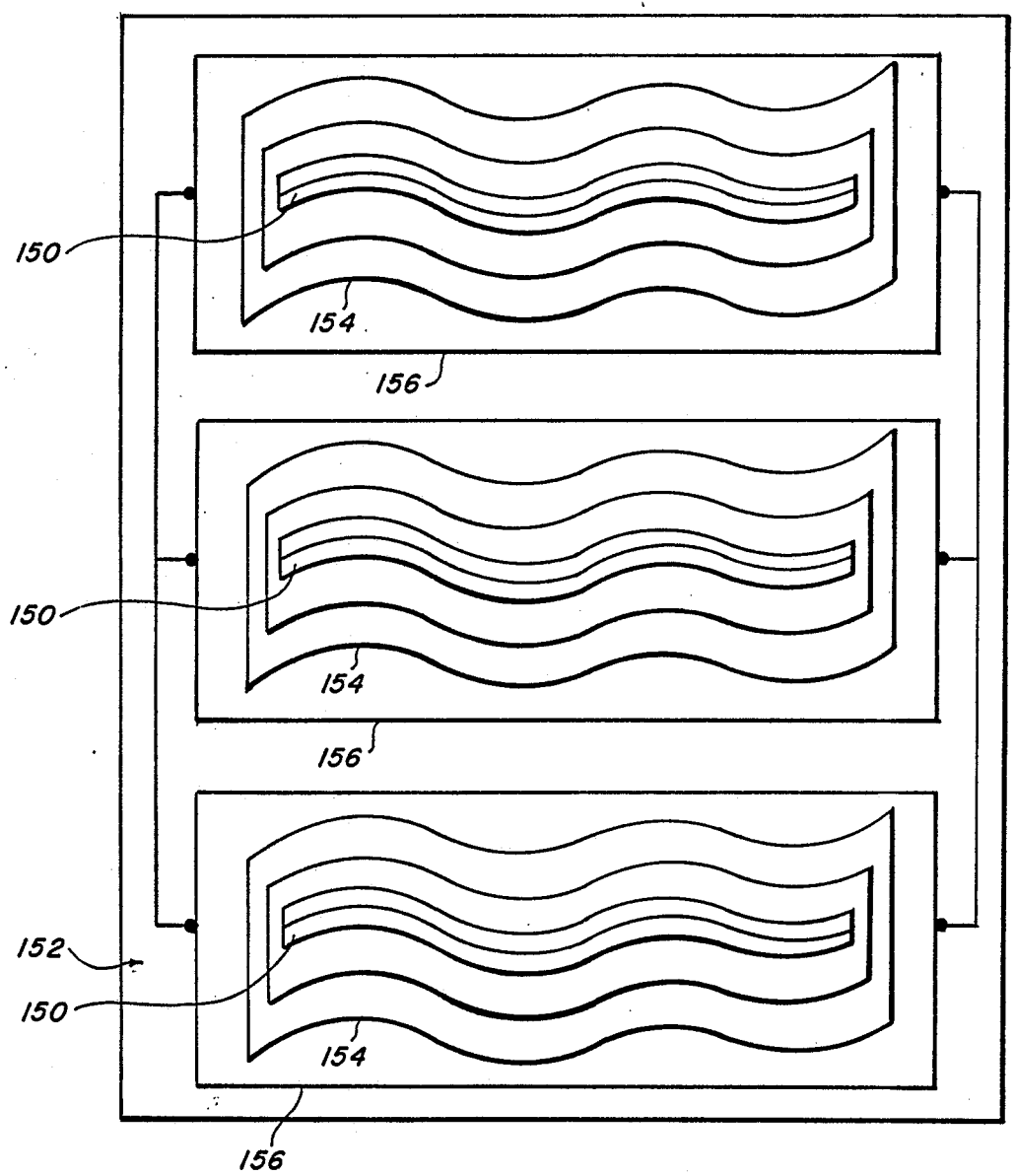
FIG. 15 is a plan view of part of a distributed amplifier module incorporating meandering field emitter cathodes, meandering grids, and anodes.

Referring now to FIG. 15, the shown distributed amplifier module includes three meandering wedge-like cathodes 150 on a common substrate 152, three meandering grids 154, and three bar-shaped anodes 156 that are interconnected at their leftmost and rightmost ends. Each grid has a meandering grid slot located above a meandering cathode. Wave direction relative to the module is from left to right so that an input wave signal can flow between a grid and the cathode or cathodes before reaching the rightmost end of the module where an output signal is available between an anode and a grid. Three meandering amplifier cells are formed by the three cathodes, three grids, and three anodes. These cells are identical in all respects, but need not be as long as the wave path length. An infinite number of cells could be designated (conceptually) in FIG. 15 since each cathode, grid and anode can be divided (conceptually) into an infinite number of cathodes, grids and anodes. FIG. 15 is a conceptual sketch in which there is no attempt to show dielectric materials that are an integral part of the transmission lines found in distributed amplifiers. The cathodes 150, grids 154 and anodes 156, are shown as transparent elements for the sake of illustrating the module.

Figure 16:
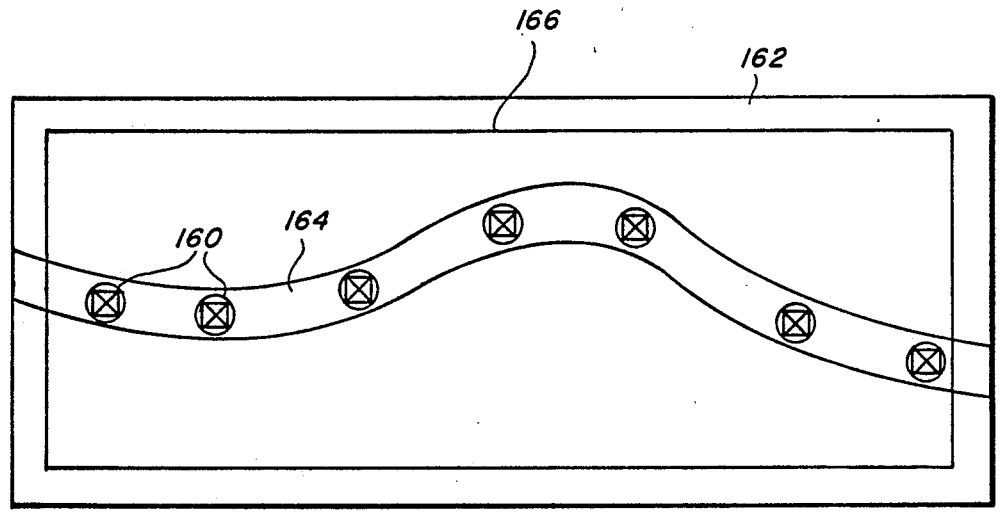
FIG. 16 is a plan view of part of a distributed amplifier module incorporating a meandering line of field emitter cathodes, a meandering grid, and an anode.

Referring now to FIG. 16, the shown structure represents a distributed amplifier module including a meandering row of four-sided pyramidal cathodes 160 poking up from the top surface of a substrate 162, a meandering grid 164 running from left to right in registry with the meandering row of cathodes, and a rectangular anode 166 overlying the grid 164 and the substrate 162. Circular (or many other shaped) grid apertures located in grid 164 overlie the cathodes. Wave direction relative to the module is from left to right so that an input wave signal can flow between the meandering line of cathodes and the meandering grid before reaching the rightmost end of the module where an output signal is available between the anode and the grid. (In the illustrated case, only one grid is shown which is common to both input and output. More than one meandering or non-meandering grid could be added). The cathodes, grid, and anode form a pair of companion stripline-like transmission lines that meander sideways as they "cross" the substrate in a rightward direction.

FIG. 16 is merely a conceptul sketch; there is no attempt to show dielectric materials that are an integral part of many of the transmission lines that are found in distributed amplifiers. The grid 164 and anode 166 are shown as transparent elements for the sake of illustrating the cathodes 160. Conceptually, the cathode sites are the sites of amplifier cells embedded in the aforesaid lines.

Figure 17:
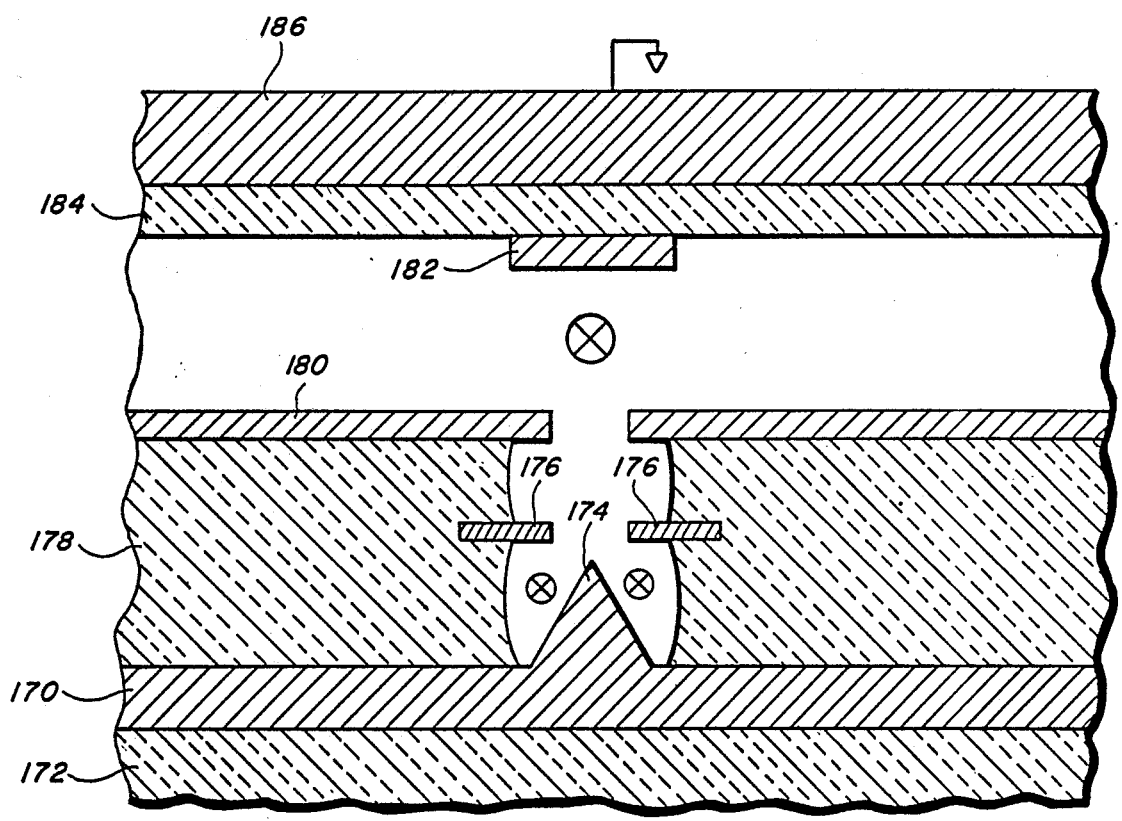
FIG. 17 is a cross-sectional view of part of a distributed amplifier and heat sink, showing cathode, grid, anode, and collector.

Referring now to FIG. 17, the shown structure represents a distributed amplifier module including a layer 170 of conductive material on a substrate 172, a wedge cathode 174 that is an integral part of layer 170, dielectric film material 178 laterally surrounding cathode 174, a two-part grid 176 containing a grid slot that overlies the cathode 174, a conductive film 180 on dielectric material 178, a slot aperture in conductive film 180 that overlies cathode 174, a narrow strip of conductive material 182 that serves as an anode located above cathode 174, a dielectric plate 184 in fixed relation to anode 182 which is affixed thereto, and a conductive layer 186 in intimate contact with layer 184. Layers 184 and 186 act as a heat sink for the distributed amplifier. An input wave signal represented by the tails of two direction arrows indicate the direction of travel of an input wave traveling through the module in a direction perpendicular to plane of the module cross section shown in FIG. 17. An output wave signal represented by the tail of a single direction arrow indicates the direction of travel of an output wave signal traveling through the module in a direction perpendicular to the plane of the module cross section shown in FIG. 17. Topmost layer 186 is grounded and is electrically connected to anode 182 by a suitable power supply connection.

Figure 18:
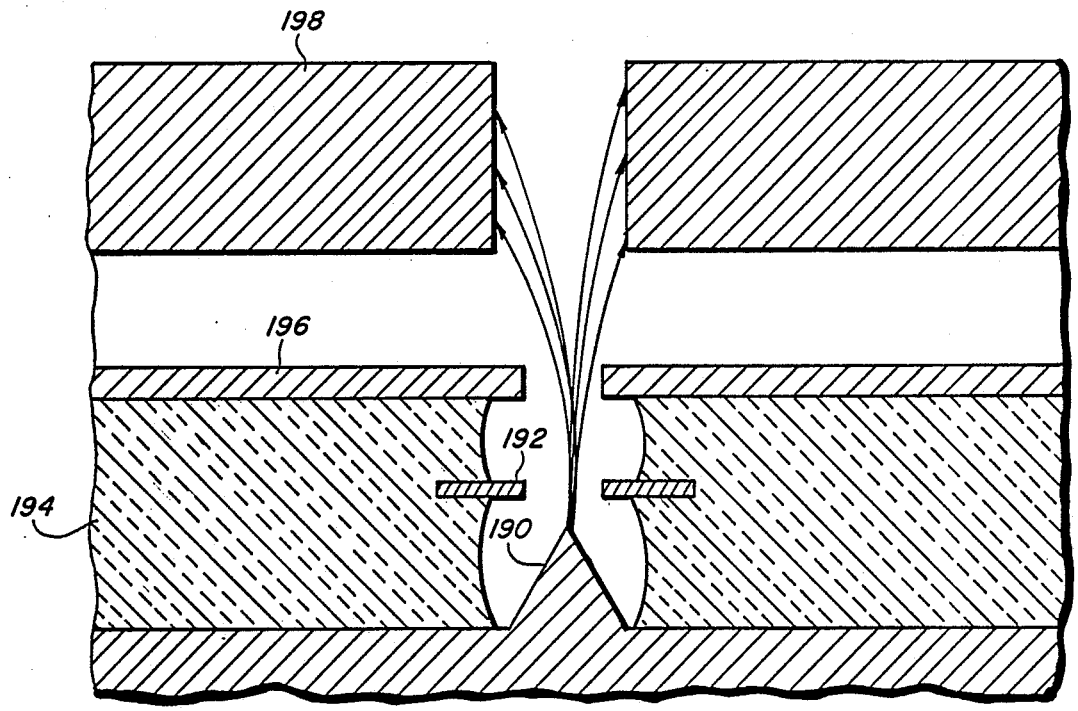
FIG. 18 is a cross-sectional view of part of a distributed amplifier incorporating a field emitter cathode, grids, and an anode and a heat sink collector, showing electron trajectories.

Referring now to FIG. 18, the shown structure represents a distributed amplifier module including a conductive surface containing an integral wedge cathode 190 poking upward through a grid slot in a grid 192 located in a body of dielectric material 194 supporting a conductive film 196 having a slot aperture located over the length of cathode 190, and including a thick anode 198 having an anode slot located above the cathode 190. The module's interior can be evacuated by means of a vacuum pump (not shown) connected to the anode slot so that electrons emitted from the peak of the cathode can reach the anode in the manner indicated in FIG. 18.

Figure 19:
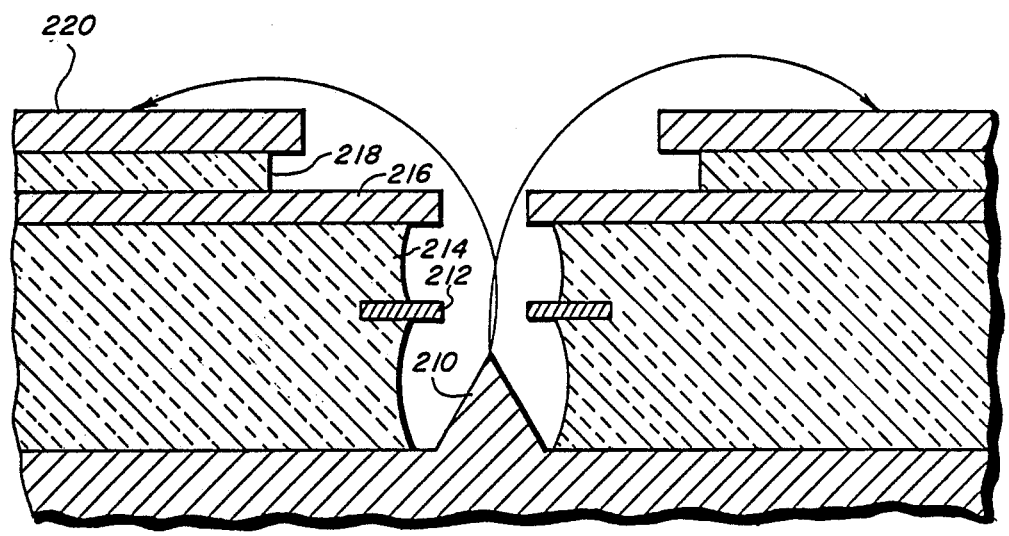
FIG. 19 is a cross-sectional view of a part of a distributed amplifier module incorporating a field emitter cathode, grids, and an anode, showing electron trajectories.

Referring now to FIG. 19, the shown structure represents a monolithic integrated distributed amplifier module including a conductive surface containing an integral wedge cathode 210 poking upward through a grid slot in grid 212 located in a body of dielectric material 214 supporting a conductive film 216 having a slot aperture located over the length of wedge cathode 210, including a dielectric film material 218 having a wide slot aperture located above cathode 210, and including an anode 220 having a wide slot aperture located over cathode 210. Electrons emitted from the peak of the cathode can reach the anode in a manner indicated in FIG. 19.

Figure 20:
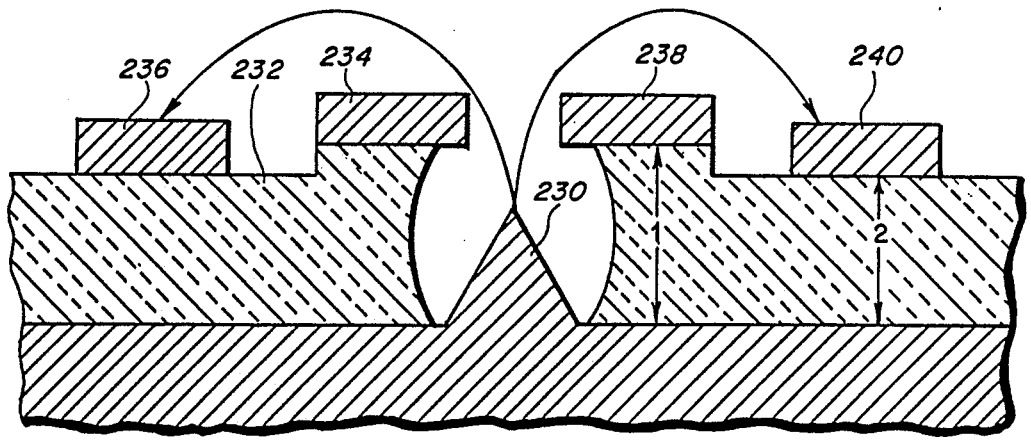
FIG. 20 is a cross-sectional view of a distributed amplifier module incorporating a field emitter cathode, grids, and anodes, showing electron trajectories.

Referring now to FIG. 20 the shown structure represents a monolithic integrated distributed amplifier module including a wedge cathode 230 laterally surrounded by dielectric film material 232 supporting a rail-shaped grid 234 and rail shaped anode 236 located to the left of cathode 230 and a rail-shaped grid 238 and rail-shaped anode 240 located to the right of cathode 230.

Figure 21:
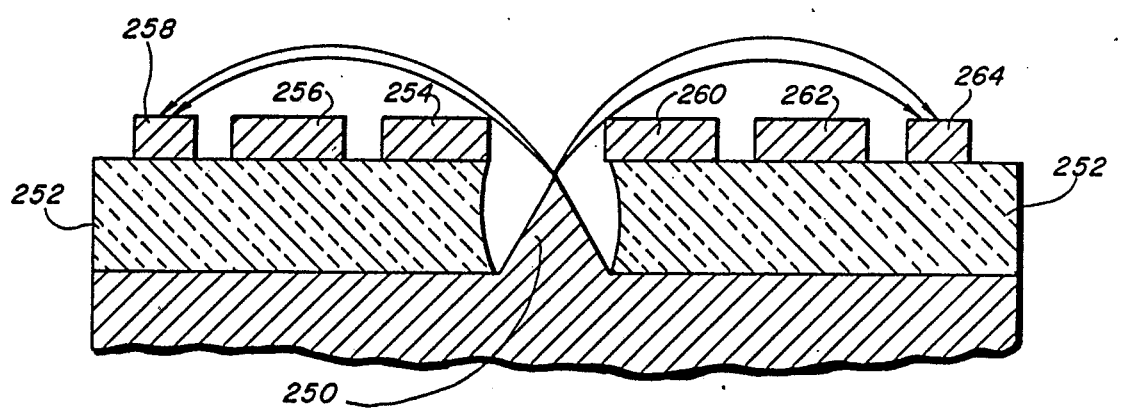
FIG. 21 is a cross-sectional view of a part of a distributed amplifier module incorporating a field emitter cathode, grids, and an anode.

Referring now to FIG. 21 the shown structure represents a monolithic integrated distributed amplifier including a wedge cathode 250 laterally surrounded by dielectric film material 252 supporting rail-shaped grid 254, a rail-shaped grid 256, and a rail-shaped anode 258 located to the left of cathode 250 and a rail-shaped grid 260, a rail-shaped grid 262, and a rail-shaped anode 264 located to the right of cathode 250. Grids are located in the same plane as the anodes because the layer-like dielectric material 252 is of uniform thickness and the substrate beneath the dielectric material 252 is a planar-surfaced substrate except for the cathode(s) 250 poking upward from the substrate. The inside rails with the substate comprise the input line. The next set of rails are for isolation (signal) (e.g. prevents feedback),the outermost rails with the substrate form the output line.

Figure 22:
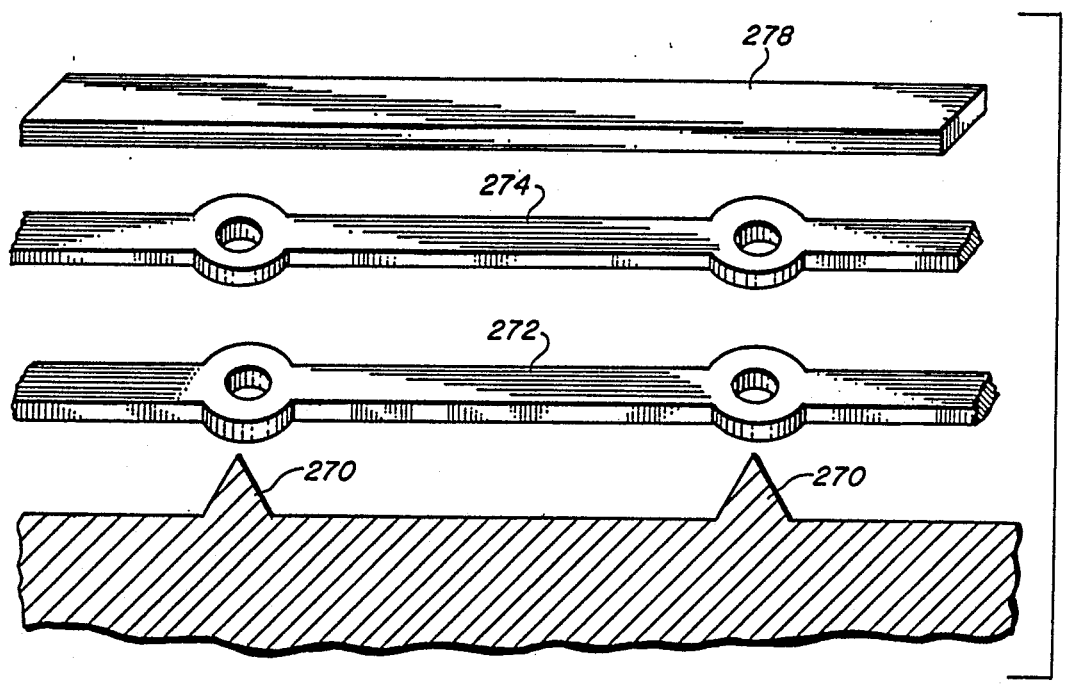
FIG. 22 is a schematic diagram of a cathode, grid, and anode arrangement wherein distributed reactive impedances are trimmed to impart desired impedance values to the impedances.
Figure 23:
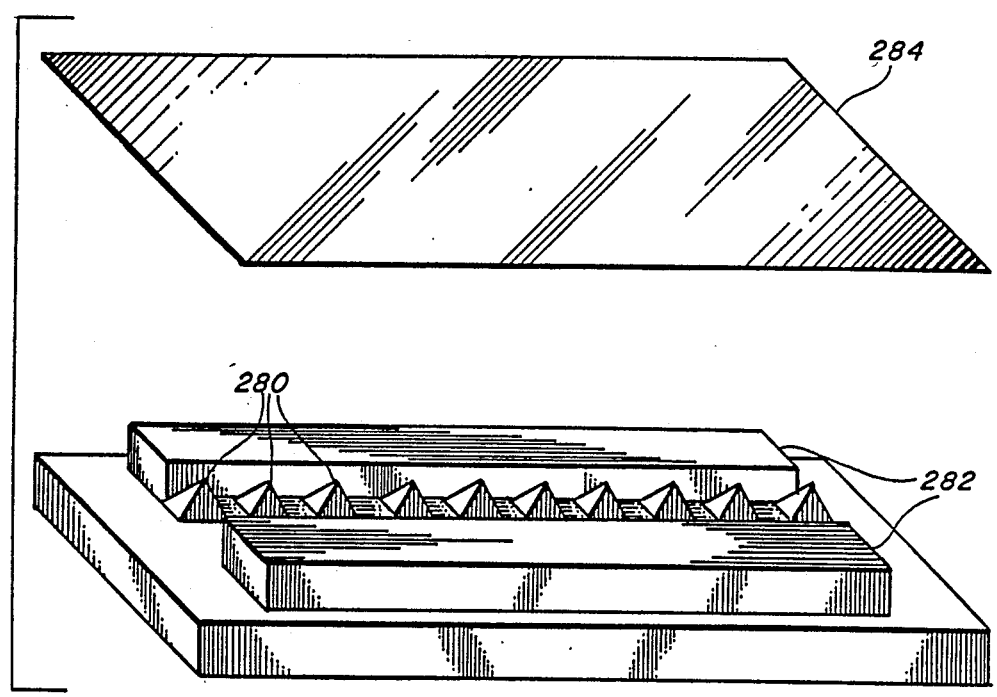
FIG. 23 is a schematic diagram of a series of cathodes, grids and an anode in a distributed amplifier module.

Referring now to FIG. 22, the shown structure includes a substructure of cone-like cathodes 270 located below a rail-like grid 272, a rail-like grid 274, and a bar-like anode 278. These elements together form two tetrode-like amplifier cells at respective locations in a rail-like device where a cathode emits electrons that flow through round grid apertures (shown) in the two rail-like grids to reach the anode 278. The lengths of the conductive materials (shown) of the grids 272 and 274 and the anode 278 introduces almost lumped element inductive impedances into the associated stripline-like transmission lines while the dielectric material (not shown) between the respective conductive materials introduces almost lumped element capacitative impedances into the transmission lines containing any number of amplifier cells embedded into the lines. By trimming the width and thickness of the conductive materials used in the device one can alter both the inductive and the capacitive values. This ability to trim the impedance values enables one to build distributed amplifiers in which the bandwidth can be very large, perhaps above 1 thz. The ability also enables one to build distributed amplifiers in which the velocity of the output wave signal is matched to the velocity of the input wave signal so that the two waves enjoy synchronous propagation along their respective transmission lines, in contrast to the situation when the output wave signal sometimes leads and sometimes lags the input signal but manages to travel the same distance in the same time span Referring now to FIG. 23, the shown structure represents a distributed amplifier having a row of equally or non-equally spaced pyramid cathodes 280 poking upward from an underlying substrate supporting a double-rail grid 282 located upon two strips of dielectric material flanking the cathodes on the substrate. A long, wide anode 284 located somewhere above the grid 282 cooperates with the cathodes 280 and grid 284 to form a rail-like distributed amplifier cell running from left to right in FIG. 23, with the grid 282 effectively dividing the structure into a lowermost part acting as an input stripline-like transmission line containing the cathodes 280 and grid 282 and an uppermost part acting as an output stripline-like transmission line containing the grid 282 and the anode 284. Since the grid 282 is the same length as the transmission lines the amplifier cell can be said to be as long as the lines. Since the cathodes 280 associate with a grid and an anode the lines can be said to contain as many amplifier cells as there are cathodes 280. Dielectric material (not shown) can be, but need not be, added to the shown structure. Anode 284 and grid 282 can be positioned in close relation to cathodes 280 to ensure that an efficient device is achieved.

Figure 24:
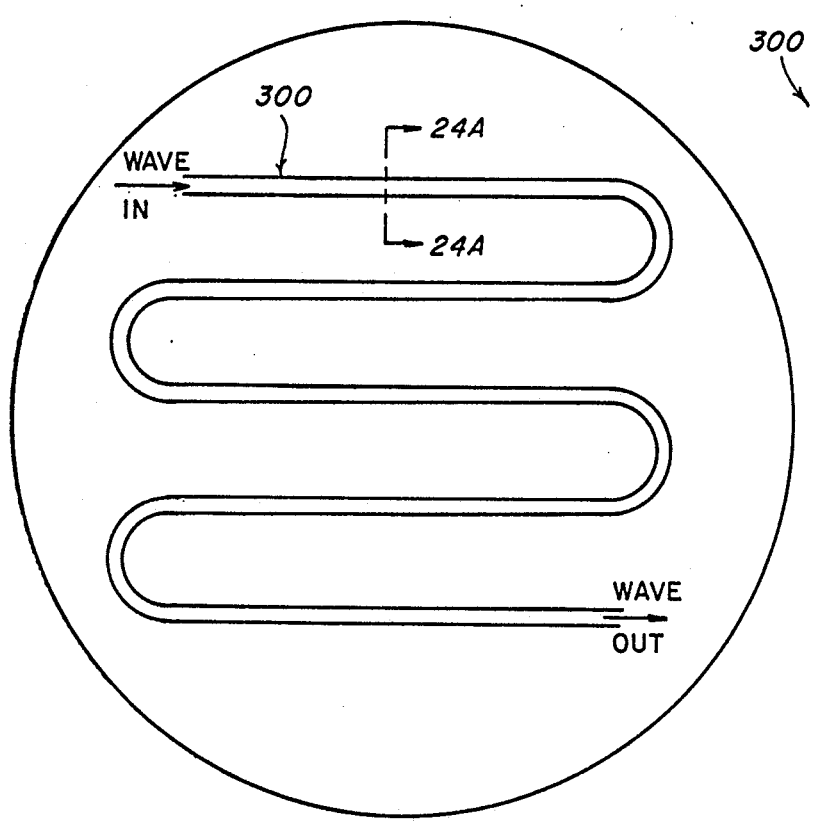
FIG. 24 is a plan view of a part of a module incorporating a cathode, grids, and an anode that follow a serpentine path.

Referring now to FIG. 24, the shown structure illustrates yet another modular monolithic integrated distributed amplifier designed in accordance with the teachings of the invention. Shown is a round, flat substrate, of circular outline, made of a non-conducting material, such as alumina ($Al_2O_3$) A long stripline 300 on the substrate has a zig-zag configuration such that the line travels from left to right, turns, travels from right to left, turns, travels from left to right, and so on. The turns are shown as round, gradual turns, but sharp turns can be used if desired. The stripline 300 is very long because it is very narrow (e.g. 6 micrometers wide) and the turns quite numerous, even though only a few turns are shown for the sake of illustrating the invention. Because of the many turns in stripline 300 the signal wave path-length in stripline 300 is very great in comparison to the distance from one end to the other end of the stripline as measured with a straight ruler.

In the plan view given in FIG. 24, the top of stripline 300 is seen. The top is laterally and longitudinally coextensive with a zig-zag anode 302 (see FIG. 24A) that is part of an output transmission line running the entire length of the distributed amplifier. An input wave entering the stripline 300 at the left upper end of the device sweeps through stripline 300 to emerge from stripline 300 at the right end where an output wave emerges at the same time because the average wave velocity of the input wave matches the average wave velocity of the output wave.

Figure 24A:
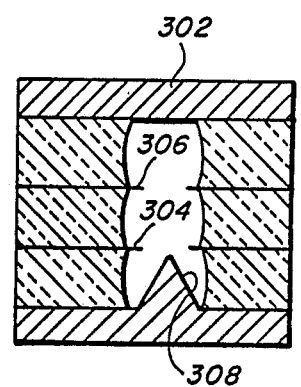
FIG. 24a is a cross-sectional view of a part of the FIG. 24 module taken along line A—A of FIG. 24.

Still referring to FIG. 24, section line A—A at a cross section taken in a plane orthogonal to the direction of wave travel in stripline 300 is shown. An enlarged view of such cross section is shown in FIG. 24A where the local structure, typical of the entire stripline, is shown on an expanded scale. The stripline is comprised, for example, of a wedge-like field emitter cathode or a set of point-like field emitters, or a set of wedge-lets, etc. made of electrically conductive material that is an integral part of the substrate which is made of an electrically non-conductive material. Anode 302 located across a cathode-grid-grid-anode region from the cathode covers a stacked arrangement of grids 304, 306 held in position by three layers of dielectric film material surrounding but not touching cathode 308.

Figure 25:
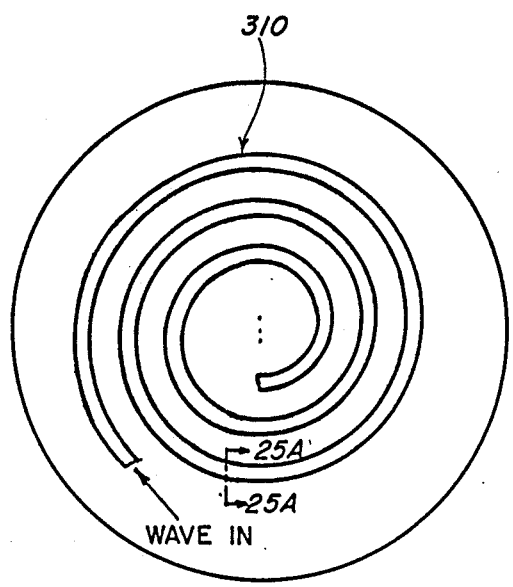
FIG. 25 is a plan view of a module incorporating a cathode, grids, and an anode that follow a spiral path.

Referring now to FIG. 25, the shown structure illustrates yet another monolithic integrated modular distributed amplifier designed in accordance with the teachings of the invention. Shown is a round, flat substrate of circular outline; made of a non-conducting material, such as alumina ($Al_2O_3$) A long, long stripline 310, located on the substrate, spirals clockwise and inward toward the center of the substrate. The stripline is very long because it is very narrow (e.g. 3 micrometers wide) and the number of turns are quits numerous, even though only a few turns are shown for the sake of illustrating the invention. Because many spirals are completed by stripline 310 the stripline path length is very great in comparision to the linear distance between the ends of the stripline as measured with a straight ruler. In the plan view given in FIG. 25, the top of the stripline is seen and this top is laterally and longitudinally coextensive with a spiral anode 312 (shown in FIG. 25A) that is part of an output, transmission line running the entire length of the companion lines of the distributed amplifier. An input wave entering stripline 310 at the outermost end sweeps through the stripline to emerge from the innermost end where an output wave emerges at the same time because the average wave velocity of the input wave matches the average wave velocity of the output wave.

Figure 25A:
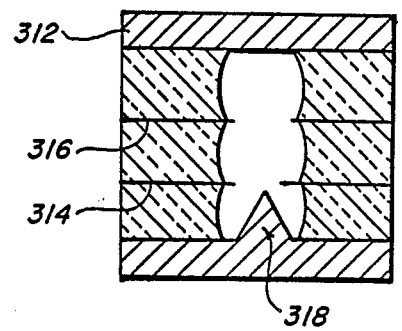
FIG. 25a is a cross-sectional view of a part of the FIG. 25 module taken along line A—A of FIG. 25.

Still referring to FIG. 25, a section line 25A—25A taken at a cross section in a plane orthogonal to the direction of the wave travel in the stripline is shown. An enlarged cross section is shown in FIG. 25A where the local structure is typical of the entire stripline. The stripline is comprised of a wedge-like field emitter cathode or a set of point-like field emitters, or a set of wedgelets, etc. made of electrically conductive material. An anode 312 located across a cathode-grid-grid-anode region from the cathode covers a stacked arrangement of grids 314, 316 held in position by three layers of dielectric film material surrounding, but not touching cathode 318.

Figure 26:
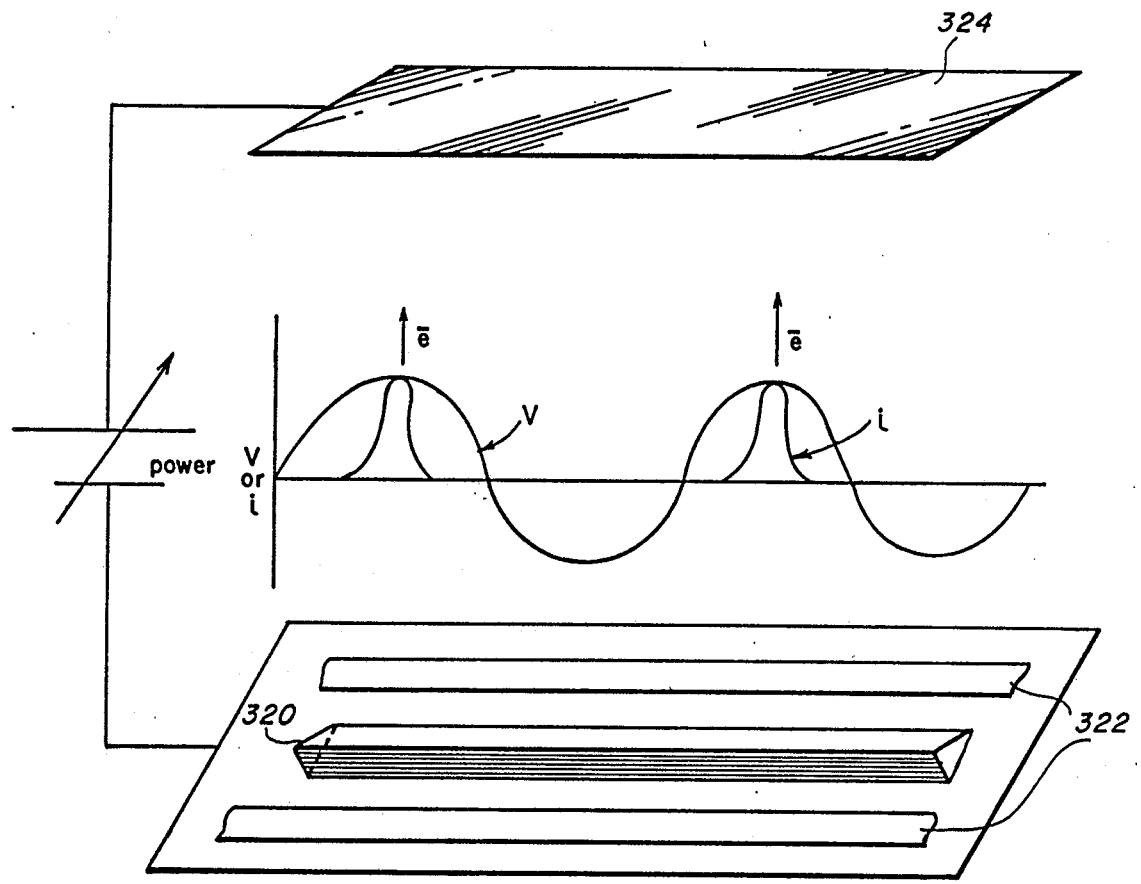
FIG. 26 is a schematic diagram of a module connected to a power supply to illustrate current and voltage relationships within an exemplary module.

Referring now to FIG. 26, there is shown signal voltage V of sinusoidal waveform representing one or more of electromagnetic waves moving together as a wave packet across typical distributed amplifier in a direction (left to right) indicated by a direction arrow. The wave pulse propagates along an input line including a wedge cathode 320 and rail i.e., ridge grid 322 through an elongated cathode-grid region, moving past successive portions of emitter cathode 320 in phase with a wave pulse (not shown) represented by an output voltage signal waveform exactly 180° out-of-phase with the input signal. Electromagnetic waves in the output signal move together as a wave pulse across the distributed amplifier in the same direction (left to right) as the input signal direction propagates in the output transmission line which includes grid 322 and anode 324. The output wave pulse propagates through the grid-anode regions, moving past successive anode portions while staying in phase with the input signal V because the aforesaid metallizations and dielectric material constitute matched companion transmission lines of equal phase velocity paired to form a transmission line matrix for a bank of amplifier cells composed of successive portions of the cathode, grid and anode. Locallized currents, i, flow from cathode 320 to anode 312 in localized cathode-grid-anode regions in a manner indicated: electrons $e^-$ flow only when a positive pulse peak of an input signal arrives at a cathode portion.

It is not possible to show and describe any and all possible variations of the invention which can be embodied in respective distributed amplifiers. Ingenuity will lead to the design of other modules that do not depart from the design principles set forth herein even though such modules are not shown herein.

There are a few designs, not shown in any of the Figs, that are next mentioned because they emphasize a physical concept that should be well understood in order to truly understand the scope of the inventions.

Suppose that a distributed amplifier is built that has a long "straight" set of field emitter cathodes, a long "rail-like" grid arrangement, and a long serpentine anode that wind slowly from side to side such that when the anode "crosses" the cathode-grid line, a field emitter sits at that point. Also assume that when the input signal arrives at that point, the output also arrives at that same point after traveling a different path with a different length. The result is that input and output waves do not travel at the same rate of speed along their respective path lengths, but they are in phase at the "cross" points. In this case, the input and output waves are out of synchronism most of the time and are in sync only momentarily when the waves reach a site where a cathode-anode current is established.

Suppose further that another distributed amplifier is built that has a long field emitter cathode defining a long "straight" thin like edge, a long serpentine grid that winds slowly from side to side, and a long, narrow, "straight" anode with the result that the input and output waves do not travel at the same rate of speed along their respective path lengths. But the waves are in phase at the points where the serpentine grid crosses the cathode line. In this case, the input and output waves are out of sync most of the time and are in sync only momentarily when the waves reach a site where a cathode-anode current is established.

Suppose further that still another distributed amplifier is build that has a long meandering cathode, a long "straight" grid, and a long, "straight" anode and the input wave is impressed onto the cathode with the result that the input and output wave do not travel at the same rate of speed along their respective path lengths. But they are in phase where the serpentine cathode "crosses" the straight grid. In this case, the input and output waves are out of sync most of the time and are in sync only mementarily when the waves reach a site where a cathode-anode current is established under favorable conditions (as described earlier).

These three examples are only meant to teach, and can take on a multitude of other shapes and configurations, where the input and output waves can be out of sync, but be in phase at the active electron emitting sites, so that appropriate electron "pumping" action can occur for wave amplification.

From the above description of various distributed amplifier configurations it can be readily understood that numerous distributed amplifiers can be built without departing from the concept of the invention which covers any and all amplifiers containing field emitter cathodes.

Distributive amplification can be obtained in cathode-grid-anode configurations, in cathode-grid-grid-anode configurations, in cathode-grid-grid-grid-anode configurations, and so on, depending on design choice. Cathode-grid regions of amplifier structures are integral parts of a transmission line and grid-anode regions of amplifier structures are integral parts of an output transmission line in dual or multiple line structures. The number of grids interposed between cathode and anode is chosen by design. For example, where an extra grid or extra grids lie between a cathode-grid transmission line and the grid-anode transmission line the extra grids serve a useful purpose for example shielding input from output and preventing feedback. Transmission line,, although most efficient when impedance matched to assume maximum power output they need not always be perfectly matched and can be imperfectly matched.

Locallized "field emission" of electrons by a field emitter cathode is a highly nonlinear (exponential) function of the magnitude of a local electric field, so that electrons leaving a cathode enter nearby (often evacuated) space where the electrons are accelerated by an electric field and travel from the cathode to an anode while they undergo little or no dispersion in time and space before they reach the anode. Therefore, there is no continual loss of electron kinetic energy because electron energy loss is localized to each field emitter cathode-grid-anode region, and is not additive as is the case in linear beam tubes such as a traveling wave tubes (TWT) and other tubes. Energy given to the growing-amplitude output wave comes from an electron beam only at one point along the distributed amplifier where that beam exists, and that beam is perpendicular to the wave direction. (A traveling wave tube (TWT) amplifies a traveling electromagnetic wave which moves essentially in the same direction as the electron beam direction rather than perpendicular to the beam as in the case of a field emitter array integrated distributed amplifier).

The Field Emitter Array Distributed Amplifiers of this invention are devices implementing a distributed electron emission process where electron trajectories are essentially perpendicular to the wave direction. As a peak amplitude with positive (+) electric potential passes over a field emitter cathode, electrons travel through a local vacuum (optional) near the cathode. This vacuum can be established merely by operating the circuit in outer space where vacuum is pervasive and where a vacuum surrounds the circuit if and when the cathode-to-anode regions are not hermetically sealed. But vacuum in the amplifiers is not essential or required. All that is required is that electron mean free path be long compared with the trajectory path length of the electrons needed for an anode. Electrons are accelerated past an "extraction" grid, without being intercepted by the grid, before reaching a local anode. Electrons gain energy from the aforesaid collector anode power supply as they are field accelerated to the anode.

Since the anode(s) can be made to include one or more anode apertures to allow accelerated electrons to pass through the anode(s) it is possible to send the electrons through one or more anodes to another anode that can at last collect the electrons.

A main advantage of the distributed amplifiers of the invention is that due to the extremely nonlinear field emission characteristic the electron current is highly peaked at the peak of inputted traveling waves. Paired input and output waves travel more or less in phase with each other in the transmission lines, and the inputted electromagnetic wave is amplified with essentially little or no out-of-phase electron beam-wave interaction.

Other advantages of the invention include the following: A method of distributively amplifying a traveling electromagnetic wave at ultra-high frequencies is provided. Integrated wide-band amplifiers are provided. Devices that can be readily manufactured and easily fabricated by microelectronic processing techniques are provided. Devices can be made from a variety of chosen materials including metals such as aluminum, tungsten, molybdenum, superconductors, conducting silicides, e.g. $CoSi_2$, $NiSi_2$, and conducting organics as well as semiconductors such as silicon and gallium arsenide; and including silicon dioxide, $Al_2O_3$ and organic dielectric materials.

The substrate can be made of conducting material, such as metal, or superconducting material, or a semiconductor material (e.g. silicon). The field emitter cathodes can be made from any appropriate cathode material such as silicon, tungsten, composites, layered materials, silicides, carbides, etc. Devices in which both substrate and cathodes are made of the same "electron-emissive" material, instead of different materials, are possible.

The dielectric materials separating metallized patterns in the devices can be varied in composition to obtain variable dielectric constants appropriate for specific areas of the dielectric films so that capacitive impedances associated with these specific areas will depend not only on dimensions of the material but also on chemical variations in materials utilized.

The anode can, but need not, be in the form of one or more films as above-described, and can assume myriad forms. The distances separating anodes from grids and cathodes from grids can but need not, be different for each cathode-grid-anode formation in an array of many such formations.

The invention provides for amplification of input signals in the form of pulses, etc., by a distributed amplifier with one or more (or even an infinite number of) field emitter cathodes within a monolithic integrated distributed amplifier structure where the cathode(s) of amplifier cells are embedded in stripline-like transmission lines.

The invention provides one or more devices useful for medium power amplification of inputted microwaves or of inputted millimeter waves or of inputted submillimeter waves, with one or more field emitter cathodes incorporated into such devices.

The invention further provides an ultra-high frequency, wide-bandwidth, integrated device or devices, actually an integrated distributed amplifier, incorporating one or more field emitter cathodes, and useful primarily, but not exclusively, for medium power amplification of inputted microwaves and inputted millimeter waves, or of inputted submillimeter waves.

This invention provides (in some instances) a collection or group of field emitter cathodes serving as electron sources that send electrons past a gate electrode called a grid to a collector electrode called an anode in an integrated distributed amplifier where a propagating input signal and a propagating output signal move as companion waves through a distributed amplifier.

The distributed amplifiers can be built to include a collection of distributed amplifiers which can be operated so that when one amplifier is "pulling", the other amplifier is "pushing", and so that Class A, Class B, Class A-B, and Class C amplification can be achieved. For example, in order to increase device efficiency, two identical distributed amplifiers could be "side-by side" on the same substrate, and could be driven by a balanced line input (which in turn could be driven by an unbalanced line through a balun. The output from such a pair could also be joined through an output balun on order to drive a single transmission line.

Distributed amplifiers provide a technique for wide-band amplification of signals at microwave frequencies, submicrowave frequencies, millimeter wave frequencies, and submillimeter wave frequencies. This technique may even be used to amplify low frequency (even direct current) signals.

When a cathode made of Silicon is used in a distributed amplifier, the cathode can be formed by etching "100" Silicon to obtain a wedge-cathode or by etching 110 Silicon to obtain razor-thin, "fence-like", thin-film cathode. Both cathode shapes provide a line-like cathode edge.

Obviously many modifications and variations of the invention are possible in light of the above teachings. It is therefore to be understood that within the scope of the appended claims the invention may be practiced otherwise than as specifically described.

What is claimed and desired to be secured by Letters Patent of the United States is:

1. A distributed amplifier comprising,
   a grid;
   a collector; and
   a field emitter;
   wherein said grid and said emitter are adapted to form an input electromagnetic waveguide for said amplifier, and said collector and said emitter are adapted to form an output electromagnetic waveguide for said amplifier, both said input electromagnetic waveguide and said output electromagnetic waveguide being adapted to have equal impedance effective to cause the speed of electromagnetic propagation in each said waveguide to be substantially equal;
   and wherein said emitter is in the shape of an elongate wedge disposed along an elongate distance substantially parallel to the direction of electromagnetic propagation in each said waveguide.

2. The amplifier of claim 1, wherein said grid is a pair of elongate ridges extending along said elongate distance on either side of said emitter.

3. The amplifier of claim 2, wherein said elongate wedge has a pointed apex extending along said elongate distance.

4. The amplifier of claim 3, wherein said elongate wedge is generally triangularly shaped in cross-section taken by a plane perpendicular to said direction of electromagnetic propagation.

5. The amplifier of claim 4, wherein said elongate distance is a straight line.

6. The amplifier of claim 5, wherein said grid, said collector, and said emitter are formed unitarily in a semiconductor monolith.

7. The amplifier of claim 1, wherein said elongate wedge has a pointed apex extending along said elongate distance.

8. The amplifier of claim 1, wherein said elongate wedge is generally triangularly shaped in cross-section taken by a plane perpendicular to the said direction of electromagnetic propagation.

9. The amplifier of claim 1, wherein said elongate distance is a straight line.

* * * * *